United States Patent
Nakata

(10) Patent No.: US 12,069,875 B2
(45) Date of Patent: Aug. 20, 2024

(54) ELECTRONIC APPARATUS INCLUDING DISPLAY WITH FIRST AND SECOND IMAGE SENSORS

(71) Applicant: Sony Semiconductor Solutions Corporation, Kanagawa (JP)

(72) Inventor: Masashi Nakata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 64 days.

(21) Appl. No.: 17/779,761

(22) PCT Filed: Nov. 25, 2020

(86) PCT No.: PCT/JP2020/043896
§ 371 (c)(1),
(2) Date: May 25, 2022

(87) PCT Pub. No.: WO2021/111955
PCT Pub. Date: Jun. 10, 2021

(65) Prior Publication Data
US 2023/0026442 A1      Jan. 26, 2023

(30) Foreign Application Priority Data

Dec. 4, 2019   (JP) ................................. 2019-219864

(51) Int. Cl.
*H10K 39/32*     (2023.01)
*H01L 27/146*    (2006.01)
(Continued)

(52) U.S. Cl.
CPC ....... *H10K 39/32* (2023.02); *H01L 27/14621* (2013.01); *H01L 27/14645* (2013.01);
(Continued)

(58) Field of Classification Search
CPC ...... H10K 39/32; H10K 30/20; H04N 25/131; H04N 23/55; H04N 23/57; H04N 23/62;
(Continued)

(56) References Cited

U.S. PATENT DOCUMENTS 6,137,100 A * 10/2000 Fossum ............. H01L 27/14645
                                                       348/277
11,294,422 B1 * 4/2022 Srikanth ................ H04N 23/63
(Continued)

FOREIGN PATENT DOCUMENTS

JP    2003-250071 A    9/2003
JP    2005-094219 A    4/2005
(Continued)

OTHER PUBLICATIONS

International Search Report (PCT/ISA/210), International Application No. PCT/JP2020/043896, dated Feb. 16, 2021.

*Primary Examiner* — Jennifer D Bennett
(74) *Attorney, Agent, or Firm* — Michael Best & Friedrich LLP

(57) ABSTRACT

Electronic apparatuses that prevent image quality deterioration of an image captured by a camera while reducing a bezel width are disclosed. In one example, an electronic app mprises a display including a display surface, a first image sensor configured to detect light in a direction incident upon the display surface and arranged under the display surface in a cross sectional view, and a second image sensor disposed separately from the first image sensor, the second image sensor being configured to detect light in the direction incident upon the display surface and arranged at a level lower than the display surface in the cross sectional view. The sensitivity of the first image sensor to a first wavelength band that includes blue light is higher than sensitivity of the second image sensor to the first wavelength band.

18 Claims, 24 Drawing Sheets

(51) Int. Cl.
*H04N 23/13* (2023.01)
*H04N 23/55* (2023.01)
*H04N 23/56* (2023.01)
*H04N 23/57* (2023.01)
*H04N 23/62* (2023.01)
*H04N 25/13* (2023.01)
*H04N 25/131* (2023.01)
*H04N 25/79* (2023.01)
*H10K 30/20* (2023.01)

(52) U.S. Cl.
CPC ............. *H04N 23/13* (2023.01); *H04N 23/55* (2023.01); *H04N 23/56* (2023.01); *H04N 23/57* (2023.01); *H04N 23/62* (2023.01); *H04N 25/135* (2023.01); *H04N 25/79* (2023.01); *H10K 30/20* (2023.02); *H01L 27/14625* (2013.01); *H01L 27/14665* (2013.01); *H04N 25/131* (2023.01)

(58) Field of Classification Search
CPC ...... H04N 25/135; H04N 25/79; H04N 23/45; H04N 23/56; H04N 23/72; H04N 23/80; H01L 27/14645; H01L 27/14665; H01L 27/14618; H01L 27/14625; H01L 27/14621
See application file for complete search history.

(56) References Cited

U.S. PATENT DOCUMENTS

| | | | |
|---|---|---|---|
| 2015/0304535 A1* | 10/2015 | Smits | G06V 30/142 348/78 |
| 2016/0372520 A1* | 12/2016 | Joei | H10K 39/32 |
| 2017/0303790 A1 | 10/2017 | Bala | |
| 2020/0083297 A1 | 3/2020 | Joei | |
| 2021/0377496 A1* | 12/2021 | Kim | H04N 25/778 |
| 2023/0140768 A1* | 5/2023 | Nakata | H04N 25/135 348/220.1 |

FOREIGN PATENT DOCUMENTS

| | | |
|---|---|---|
| JP | 2005-112235 A | 4/2005 |
| JP | 2006-237914 A | 9/2006 |
| JP | 2009-010675 A | 1/2009 |
| JP | 2018-056940 A | 4/2018 |
| JP | 2018-093052 A | 6/2018 |
| JP | 2019-004358 A | 1/2019 |
| KR | 20150000293 A | 1/2015 |
| WO | 2013/187132 A1 | 12/2013 |
| WO | 2015/029709 A1 | 3/2015 |
| WO | WO-2018101078 A1 | 6/2018 |

* cited by examiner

ELECTRONIC APPARATUS INCLUDING DISPLAY WITH FIRST AND SECOND IMAGE SENSORS

TECHNICAL FIELD

The present disclosure relates to an electronic apparatus.

BACKGROUND ART

A typical electronic apparatus such as a smartphone, a tablet, a game machine, and a PC (Personal Computer) includes a camera mounted on a bezel of a display unit. This camera is called a front camera and is used for video calling or selfie capturing.

A user who uses an electronic apparatus often carries the electronic apparatus in a pocket or a bag. Accordingly, there has been a demand for an electronic apparatus having a compact housing. Moreover, there has also been a demand for an electronic apparatus which enlarges a screen size to increase visibility of tent and display a high-resolution image. For meeting these demands, an electronic apparatus having a reduced bezel width and an electronic apparatus of a no-bezel type have currently been developed.

A front camera is often mounted on a bezel. In this case, a bezel width of an electronic apparatus cannot be reduced to a size smaller than an outside diameter size of the camera. Moreover, a visual line of the user is often directed toward the vicinity of the center of a display screen during imaging. Accordingly, an unnatural image including a person whose visual line is not directed toward the front is likely to be formed when the camera disposed on the bezel is used for imaging.

For avoiding the problem described above, it has been proposed to provide a camera module on the side opposite to a display surface of a display unit and capture an image with use of light having passed through the display unit.

CITATION LIST

Patent Literature

[PTL 1]
  PCT Patent Publication No. WO2013/187132

SUMMARY

Technical Problem

However, light having passed through the display unit is attenuated in a wavelength band including blue light as a result of absorption or reflection of the light. Therefore, there has been a problem that image quality of a captured image deteriorates in comparison with cameras disposed at other positions.

Accordingly, the present disclosure provides an electronic apparatus capable of preventing image quality deterioration of an image captured by a camera while reducing a bezel width.

Solution to Problem

An electronic apparatus according to one aspect of the present disclosure includes a display unit disposed on a first surface, a first imaging unit disposed on a side opposite to a display surface of the display unit, and a second imaging unit disposed on a second surface on a side opposite to the first surface. Sensitivity of the first imaging unit to a first wavelength band that includes blue light may be higher than sensitivity of the second imaging unit to the first wavelength band.

The first imaging unit may receive light having passed through the display unit.

A ratio of blue light detection pixels in a pixel array of the first imaging unit may be higher than a ratio of blue light detection pixels in a pixel array of the second imaging unit.

The blue light detection pixels may include at least any of a blue pixel, a magenta pixel, and a cyan pixel.

The first imaging unit may include at least any of a cyan pixel, a magenta pixel, and a yellow pixel.

A first light source disposed on the first surface and configured to emit blue light during imaging by the first imaging unit may be further provided.

A second light source disposed on the first surface and configured to emit white light during imaging by the first imaging unit may be further provided. A processing circuit configured to generate an image by synthesizing a first image and a second image, the first image being captured by the first imaging unit during light emission from the first light source, the second image being captured by the first imaging unit during light emission from the second light source, may be further provided.

A first light source disposed on the first surface and configured to emit light during imaging by the first imaging unit may be further provided. The second imaging unit disposed on the second surface on the side opposite to the first surface may be provided. A third light source disposed on the second surface and configured to emit light during imaging by the second imaging unit may be further provided. A color temperature of the first light source may be higher than a color temperature of the third light source.

A third imaging unit that is disposed on the side opposite to the display surface of the display unit and has lower sensitivity to the first wavelength band than the sensitivity of the first imaging unit to the first wavelength band may be further provided. A processing circuit configured to generate an image by synthesizing a third image captured by the first imaging unit and a fourth image captured by the third imaging unit may be further provided.

The first imaging unit may have multiple photoelectric conversion units arranged in a depth direction of a substrate.

At least any one of the multiple photoelectric conversion units may include an organic photoelectric conversion film.

An electronic apparatus according to one aspect of the present disclosure includes a display unit disposed on a first surface, and a first imaging unit that is disposed on a side opposite to a display surface of the display unit and includes multiple pixels for photoelectrically converting light having entered via the display unit. A ratio of blue light detection pixels included in the multiple pixels may be higher than 1/4.

The blue light detection pixels may include at least any of a blue pixel, a magenta pixel, and a cyan pixel.

The first imaging unit may include at least any of a cyan pixel, a magenta pixel, and a yellow pixel.

A first light source disposed on the first surface and configured to emit blue light during imaging by the first imaging unit may be further provided.

A second light source disposed on the first surface and configured to emit white light during imaging by the first imaging unit may be further provided. A processing circuit configured to Generate an image by synthesizing a first image and a second image, the first image being captured by the first imaging unit during light emission from the first light source, the second image being captured by the first imaging unit during light emission from the second light source, may be further provided.

A first light source disposed on the first surface and configured to emit light during imaging by the first imaging unit may be further provided. A second imaging unit disposed on a second surface on a side opposite to the first surface may be further provided. A third light source disposed on the second surface and configured to emit light during imaging by the second imaging unit may be further provided. A color temperature of the first light source may be higher than a color temperature of the third light source.

A third imaging unit that is disposed on the side opposite to the display surface of the display unit and has a lower ratio of the blue light detection pixels than a ratio of the blue light detection pixels of the first imaging unit may be further provided. A processing circuit configured to generate an image by synthesizing a third image captured by the first imaging unit and a fourth image captured by the third imaging unit may be further provided.

The first imaging unit may have multiple photoelectric conversion units arranged in a depth direction of a substrate.

At least any one of the multiple photoelectric conversion units may include an organic photoelectric conversion film.

DESCRIPTION OF EMBODIMENTS

Preferred embodiments of the present disclosure will hereinafter be described in detail with reference to the accompanying drawings. Note that constituent elements having substantially identical functional configurations are given identical reference signs in the present description and the drawings to omit repetitive explanation.

Figure 1:
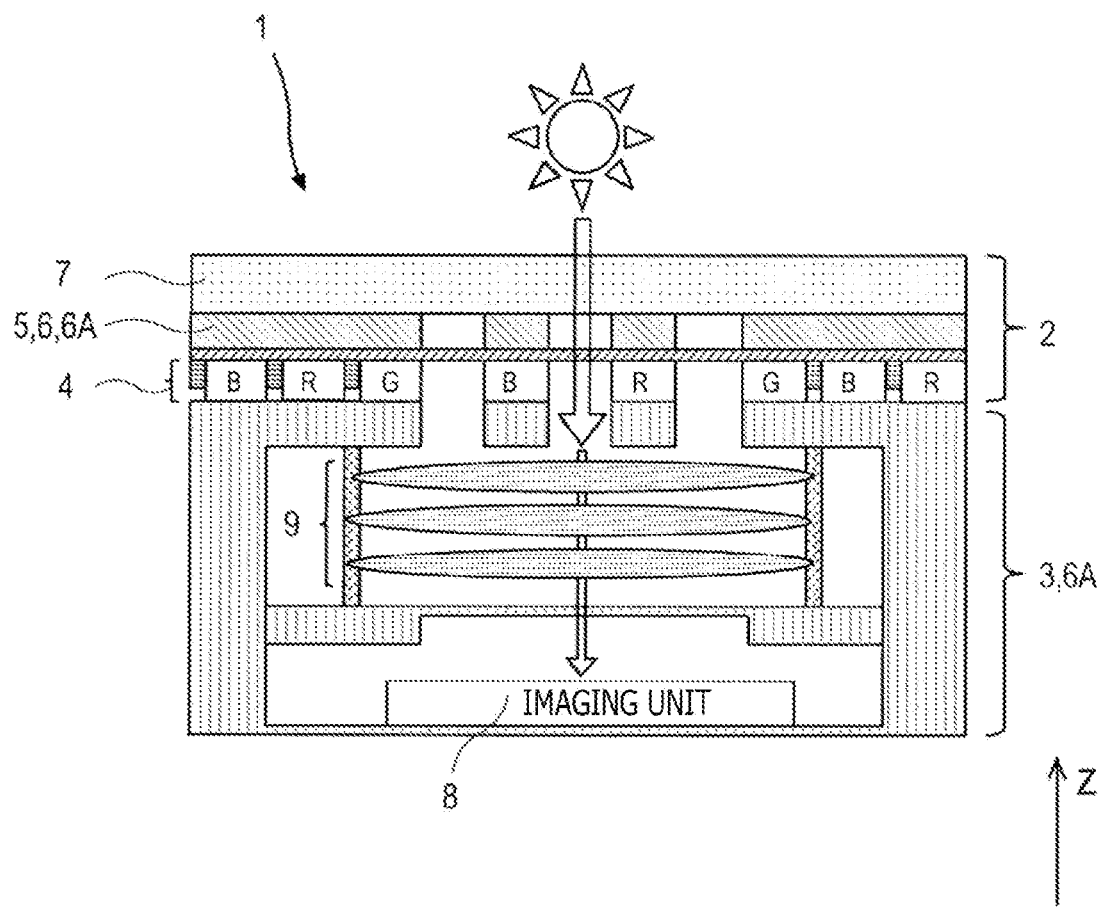
FIG. 1 is a schematic cross-sectional diagram of an example of an electronic apparatus according to the present disclosure.

FIG. 1 is a schematic cross-sectional diagram of an electronic apparatus 1 according to a first embodiment. The electronic apparatus 1 in FIG. 1 has an image display function and an image capturing function. For example, the electronic apparatus 1 is a smartphone, a tablet, a game machine, an in-vehicle device, or a PC. Note that the electronic apparatus is not limited to any type.

The electronic apparatus 1 in FIG. 1 includes a display unit 2 and a camera module 3 (imaging unit). The camera module 3 is mounted on the side opposite to a display surface (z-axis positive direction side surface) of the display unit 2. Specifically, the camera module 3 is disposed at a position on the rear side of the display unit 2 when the display unit 2 in FIG. 1 is viewed from the front (from the z-axis positive direction side). Accordingly, the camera module 3 of the electronic apparatus 1 captures an image with use of light having passed through the display unit 2.

Figure 2:
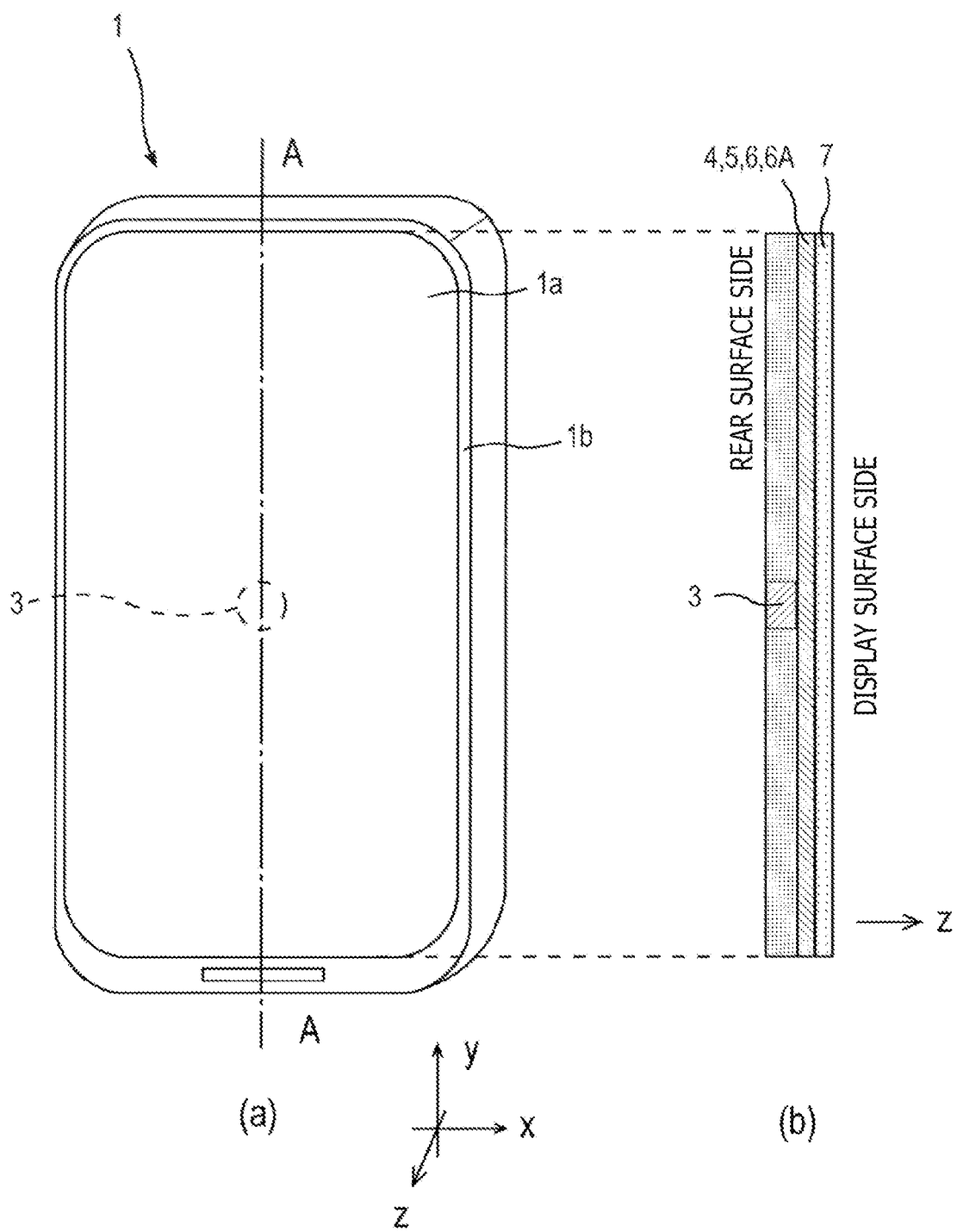
FIG. 2(a) is a schematic external diagram of the electronic apparatus in FIG. 1, and (b) is a cross-sectional diagram taken along a line A-A direction.

FIG. 2(a) is a schematic external diagram of the electronic apparatus 1 in FIG. 1. Meanwhile, FIG. 2(b) is a cross-sectional diagram taken along a line A-A direction in FIG. 2(a). In the example depicted in FIG. 2(a), a display screen 1a extends to the vicinity of an edge of the electronic apparatus 1. Accordingly, a width of a bezel 1b on an outer circumference of the display screen 1a has a length of several millimeters or smaller. According to the electronic apparatus 1 in FIG. 2(a), the camera module 3 is disposed not on the bezel 1b but on the side opposite to the display screen 1a (broken line). The camera module 3 is available as a front camera of the electronic apparatus 1. Disposing the camera module 3 on the side opposite to the display screen 1a as described above eliminates the necessity of providing a front camera on the bezel 1b. Accordingly, an electronic apparatus having a reduced bezel width, or a bezel-less type electronic apparatus can be provided to users.

Note that the camera module 3 in FIG. 2(a) is disposed on the rear side of a position corresponding to substantially the center of the display screen 1a when the electronic apparatus 1 is viewed from the front in the z-axis positive direction. However, the camera module 3 is allowed to be disposed at any position (x-coordinate and y-coordinate) on the side opposite to the display screen 1a. For example, the camera module 3 may be disposed on the side opposite to a position near the edge of the display screen 1a. The camera module 3 according to the present disclosure is allowed to be disposed at any position on the rear side of the display screen when the display screen is viewed from the front.

As depicted in FIG. 1, a structure which is a sequential lamination of a display panel 4, a circularly polarized plate 5, a touch panel 6, and a cover glass 7 can be used as the display unit 2. For example, the display panel 4 is a plate-shaped structure which displays an image by using an electric method. For example, the display panel 4 is an OLED (Organic Light Emitting Device), a liquid crystal panel, or a MicroLED. However, the display panel 4 is not limited to any type.

Generally, the display panel 4 such as an OLED and a liquid crystal panel has multiple layers. For example, the display panel 4 of some types includes a component which lowers light transmittance, such as a color filter layer. Accordingly, as depicted in FIG. 1, a through hole may be formed in alignment with the position of the camera module 3 within the component preventing light transmission in the display panel 4. Light having passed through the through hole is allowed to enter the camera module 3 without passing through the corresponding component. In this manner, image quality deterioration of an image captured by the camera module 3 is avoidable.

For example, the circularly polarized plate 5 is mounted for purposes of reduction of glares, improvement of visibility, and others. The touch panel 6 is a plate-shaped structure into which a touch sensor is incorporated. For example, the touch sensor is a capacitance type touch sensor or a resistive film type touch sensor. However, any type of touch sensor may be used. Note that the electronic apparatus of the present disclosure may include a display panel having an integrated function of a touch panel. The cover glass 7 is provided to protect the display panel 4 from the outside.

Note that the display unit 2 may include a fingerprint sensor 6A. For example, an optical fingerprint sensor or an ultrasonic fingerprint sensor can be used as the fingerprint sensor 6A. However, the fingerprint sensor is riot limited to any type. For example, the fingerprint sensor 6A may be mounted in at least any one of the layers of the display unit 2. Moreover, the fingerprint sensor 6A may be mounted within the camera module 3.

For example, the camera module 3 includes an imaging unit 8 and an optical system 9. The optical system 9 is provided between the display unit 2 and the imaging unit 8. The optical system 9 concentrates light having passed through the display unit 2 on the imaging unit 8. The optical system 9 may include multiple lenses.

For example, the display unit 2 includes a material such as polyimide, acryl, or epoxy. Some of these materials have a property of absorbing and reflecting light in a wavelength band including blue light. Accordingly, the imaging unit 8 which captures an image with use of light having passed through the display unit 2 has lower sensitivity to the wavelength band including blue light than that sensitivity of imaging units disposed at other positions.

Figure 3:
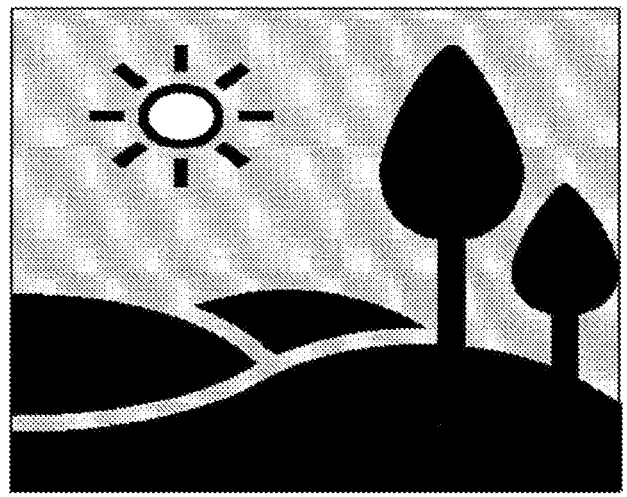
FIG. 3 is a diagram depicting an example of an image captured by a front camera disposed on a bezel.
Figure 4:
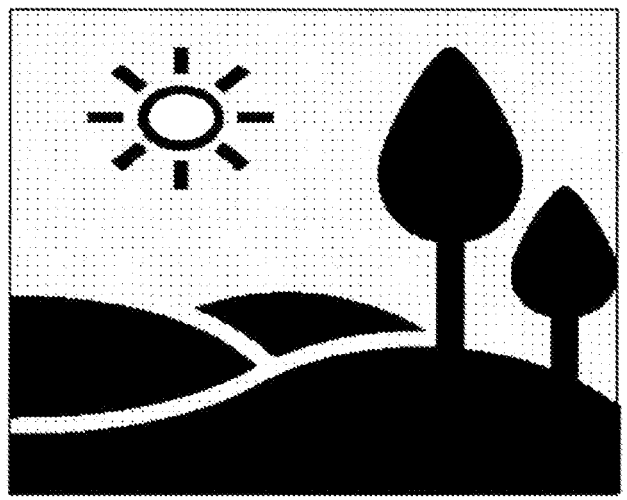
FIG. 4 is a diagram depicting an example of an image captured with use of light having passed through a display unit.

FIG. 3 depicts an example of an image captured by a front camera disposed on a bezel. Meanwhile, FIG. 4 depicts an example of an image captured with use of light having passed through the display unit 2. Each of the images in FIGS. 3 and 4 is an image of scenery. Referring to FIG. 3, blue components are clear in a part corresponding to the sky in the image. However, referring to FIG. 4, blue components are weak in a part corresponding to the sky in the image, and exhibit a light color. When sensitivity of the imaging unit to the wavelength band including blue light lowers as described above, characteristics such as color reproducibility and color noise deteriorate in the captured image. Accordingly, the electronic apparatus of the present disclosure compensates for sensitivity to the wavelength band including blue light. In this manner, image quality deterioration is avoidable even when the imaging unit 8 which captures an image with use of light having passed through the display unit 2 is used.

Figure 5:
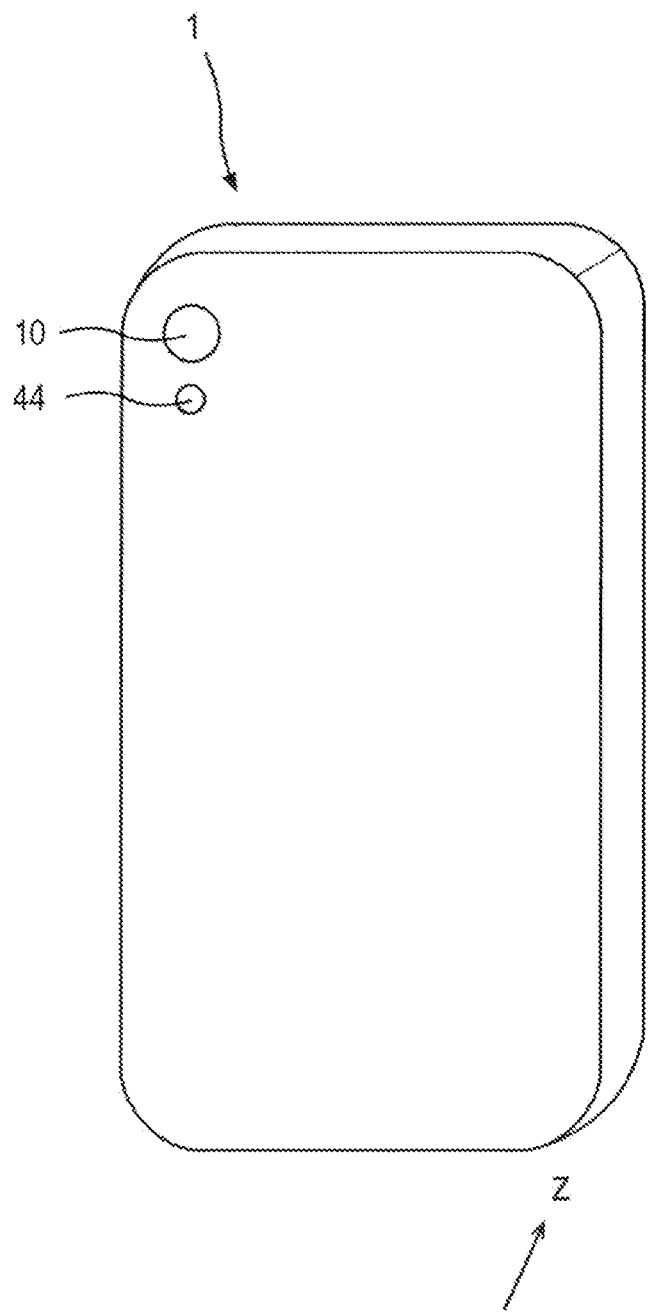
FIG. 5 is an external diagram depicting a surface of the electronic apparatus on the side opposite to that in FIG. 2(a).

FIG. 5 depicts a surface of the electronic apparatus 1 on the side (z-axis negative side) opposite to the side depicted in FIG. 2(a). As depicted in FIG. 5, the electronic apparatus 1 may further include a camera module 10 and a flash 44. The camera module 10 and the flash 44 are mounted on the side opposite to the surface where the display unit 2 of the electronic apparatus 1 is provided. The flash 44 is a light source which operates in linkage with an imaging operation performed by the camera module 10, and emits light in a direction toward an object. For example, a white LED can be used as the flash 44. However, the light source used as the flash 44 is not limited to any type.

The imaging unit (e.g., imaging unit 8) which performs imaging with use of light having passed through the display unit 2 will hereinafter be referred to as a first imaging unit. Moreover, the imaging unit disposed on the surface opposite to the display unit 2 of the electronic apparatus 1 will be referred to as a second imaging unit. The camera module 10 described above corresponds to the second imaging unit. Note that the camera module 10 disposed on the surface opposite to the display unit 2 of the electronic apparatus 1 will also be referred to as a rear camera.

Figure 6:
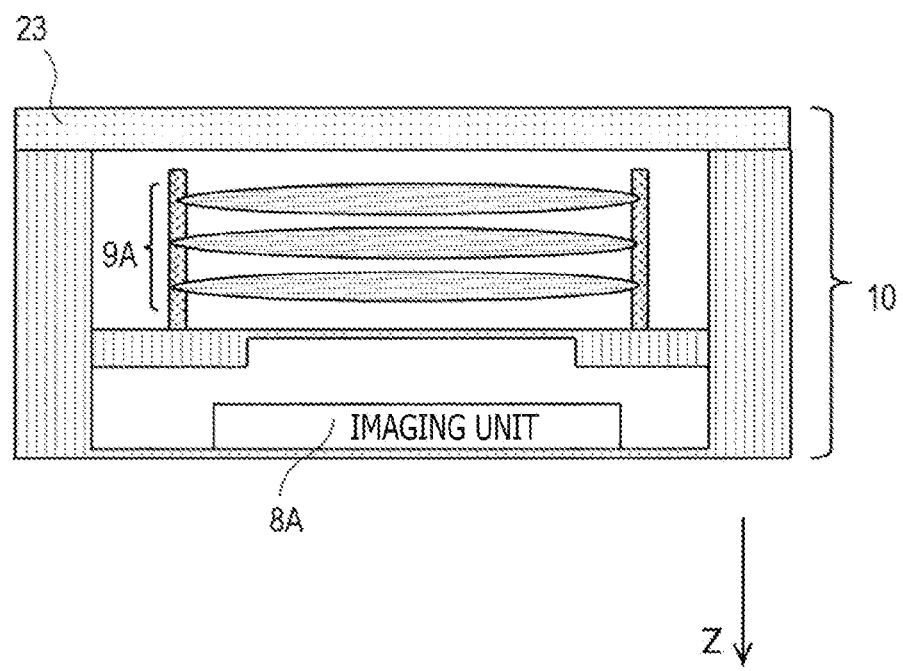
FIG. 6 is a schematic external diagram of a rear camera.

FIG. 6 is a schematic cross-sectional diagram of the camera module 10 (rear camera). The camera module 10 in FIG. 6 includes a protection cover 23, an imaging unit 8A, and an optical system 9A. The protection cover 23 includes a material capable of transmitting light, and protects the imaging unit 8A and the optical system 9A from the outside. The optical system 9A concentrates incident light on the imaging unit 8A. Light for imaging by the imaging unit 8A in FIG. 6 does not pass through the display unit unlike the imaging unit 8. Accordingly, sensitivity of the imaging unit 8A to the wavelength band including blue light does not lower unlike the imaging unit 8. The imaging unit 8A has a configuration similar to the configuration of the imaging unit 8 except for differences associated with a pixel array described below.

Figure 7:
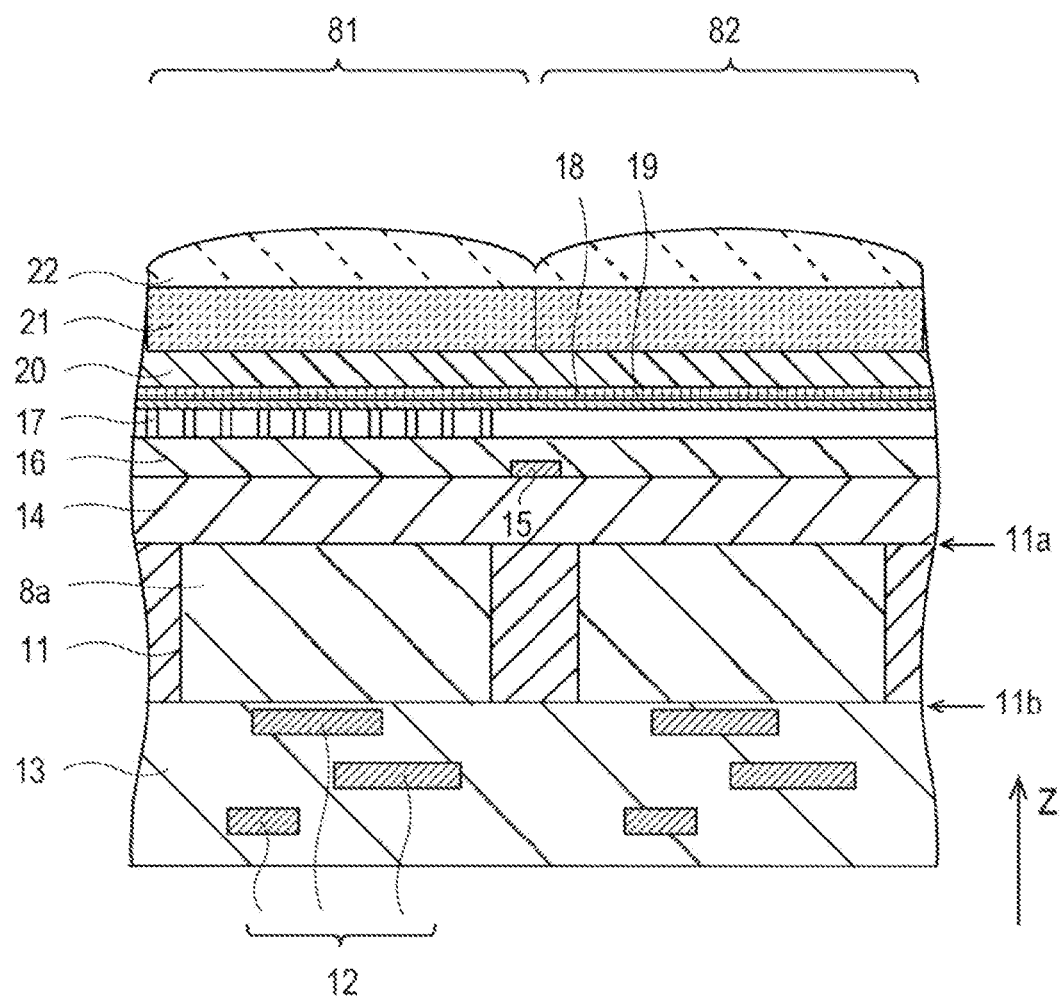
FIG. 7 is a diagram depicting an example of a detailed cross-sectional structure of an imaging unit according to the present disclosure.

FIG. 7 depicts an example of a detailed cross-sectional structure of the imaging unit. It is assumed herein that a z-axis positive direction is referred to as "upper" and that a z-axis negative direction is referred to as "lower." The imaging unit 8 in FIG. 7 includes multiple photoelectric conversion units 8a within a substrate 11. For example, each of the photoelectric conversion units 8a is a CMOS (Complementary Metal Oxid Semiconductor) sensor or a CCD (Charge Coupled. Device) sensor, the sensors including photodiodes. Alternatively, an organic photoelectric conversion film or other types of sensors may be used as each of the photoelectric conversion units 8a.

Moreover, an interlayer dielectric film 13 is formed on a surface 11a (upper side) of the substrate 11. Multiple wiring layers 12 are disposed within the interlayer dielectric film 13. At least either contacts or through electrodes (not depicted) may be provided between the photoelectric conversion units 8a and the wiring layers 12. Similarly, at least either contacts or through electrodes may be provided between the wiring layers 12.

Meanwhile, a flattening layer 14 is formed on a second surface 11b (lower side) of the substrate 11. A base insulation layer 16 is formed on the flattening layer 14. Moreover, a light shield layer 15 may be formed on a part of the flattening layer 14. The light shield. layer 15 is disposed on a boundary of pixels or in the vicinity of the pixels. At least a part of a surface of the light shield layer 15 may be in contact with the base insulation layer 16. Further, an insulation layer 17 is formed on the base insulation layer 16. Polarizers may be formed within the insulation layer 17. For example, the polarizers are wire grid polarizers having a line-and-space structure. However, there are no limitations on the structure and the arrangement direction of the polarizers.

Protection layers 18 and 19 are formed on the insulation layer 17 including multiple polarizers 8b. Further, a flattening layer 20 is formed on the protection layer 19. A color filter layer 21 is disposed on the flattening layer 20. The color filter layer 21 selectively transmits light in some wavelength bands such that the photoelectric conversion unit disposed below can detect light in a predetermined wavelength band.

In addition, an on-chip lens 22 is disposed on the color filter layer 21. The on-chip lens 22 is disposed on each of the multiple polarizers 8b in the cross-sectional structure in FIG. 5. However, the multiple polarizers 8b may be disposed on the on-chip lenses 22. In such a manner, the lamination order of the layers may be changed in the cross-sectional structure in FIG. 5.

The imaging unit 8 may include the photoelectric conversion units 8a discretely formed for each pixel. Each of the photoelectric conversion units 8a photoelectrically converts light entering via the display unit 2, and outputs a color signal of any of colors. Specifically, the imaging unit 8 is considered as a set of multiple pixels each performing photoelectric conversion and outputting a color signal. For example, the color signal is a red, green, or blue color signal. However, the color signal output from each pixel of the imaging unit 8 may be a signal indicating a color other than three primary colors of light. For example, each pixel of the imaging unit 8 may output a color signal of at least any one of cyan, magenta, and yellow which are complementary colors of three primary colors of light. Moreover, each pixel of the imaging unit 8 may output a white color signal.

The imaging unit 8 can include multiple pixels each having sensitivity to a different wavelength band. Each of the pixels of the imaging unit 8 outputs a color signal associated with a wavelength band corresponding to sensitivity. For example, as depicted in FIG. 7, the color filter layer 21 for selectively transmitting light in a predetermined wavelength band can be disposed above the photoelectric conversion units 8a to form a pixel having sensitivity to a predetermined wavelength band. For example, at least any one of the color filter layer 21 for transmitting light in a wavelength band including red, the color filter layer 21 for transmitting light in a wavelength band including green, or the color filter layer 21 for transmitting light in a wavelength band including blue can be disposed for each pixel. However, there is no limitation on the wavelength band of light to be transmitted by the color filter layer 21.

Note that the pixels each having sensitivity to the predetermined wavelength band may be formed by a method different from the foregoing method. For example, a photoelectric conversion unit having sensitivity to a predetermined wavelength band may be used instead of each of the color filters. For example, each of the photoelectric conversion units having sensitivity to the predetermined wavelength band may be formed by using an organic photoelectric conversion material. Such a photoelectric conversion unit (organic photoelectric conversion unit) is capable of detecting light in a wavelength hand different for each type or combination of the organic photoelectric conversion materials.

Moreover, it is known that an absorbed wavelength band of electromagnetic waves varies for each depth of a silicon substrate. Accordingly, the photoelectric conversion unit may be disposed at each of different depths within the silicon substrate to detect light in multiple wavelength bands. Note that an imaging unit which has multiple photoelectric conversion units (light reception surfaces) having different detection wavelength bands in a depth direction of a substrate is called a vertical spectral diffraction type imaging unit. The imaging unit of the electronic apparatus according to the present disclosure may detect light in different wavelength bands by a combination of multiple methods. For example, the imaging unit may use a combination of at least any methods selected from a color filter, a photoelectric conversion unit having sensitivity to a selective wavelength band, and vertical spectral diffraction.

Figure 8:
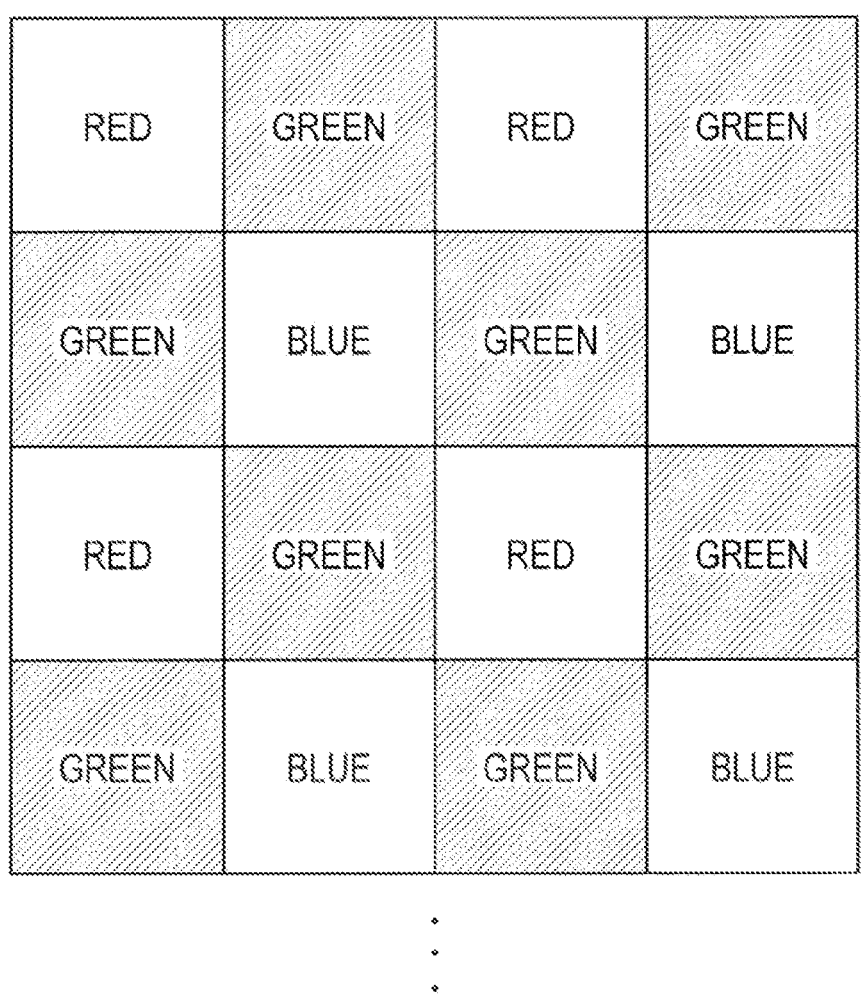
FIG. 8 is a plan diagram depicting an example of a Bayer array.

The pixel array of the imaging unit specifies a light wavelength band (color) corresponding to a detection target of each pixel. Specifically, the photoelectric conversion unit 8a of each pixel outputs a color signal corresponding to a wavelength band specified in the pixel array. A Bayer array depicted in a plan diagram of FIG. 8 is an example of a pixel array generally used. In the Bayer array, pixels (green pixels) each detecting light in a wavelength range including green and outputting a green color signal are disposed in a checkered shape. Moreover, the Bayer array further includes blue pixels and red pixels. The blue pixels each detect light in a wavelength range including blue and output a blue color signal. The red pixels each detect light in a wavelength range including red and output a red color signal. The Bayer array includes the green pixels, blue pixels, and the red pixels at a ratio of 2:1:1.

As the imaging unit (e.g., the imaging unit 8A of the camera module 10) which does not perform imaging with use of light having passed through the display unit 2, an imaging unit having a Bayer array can be used. Note that an example of a pixel array capable of compensating for the wavelength band including blue light will be described below.

Note that the imaging unit according to the present disclosure may include at least any of a cyan pixel having sensitivity to a wavelength band including cyan, a magenta pixel having sensitivity to a wavelength band including magenta, and a yellow pixel having sensitivity to a wavelength band including yellow. For example, the color filter layer 21 for transmitting light in the wavelength band including cyan can be disposed on each of the photoelectric conversion units 8a to form cyan pixels. Magenta pixels and yellow pixels are allowed to be formed by similar methods. Moreover, at least any of a red pixel, a green pixel, a blue pixel, a cyan pixel, a magenta pixel, and a yellow pixel may be formed by photoelectric conversion units each having sensitivity to a selective wavelength band, or by vertical spectral diffraction.

Described above are the examples of red pixels, green pixels, blue pixels, cyan pixels, magenta pixels, and yellow pixels. However, the pixels of the imaging unit according to the present disclosure are not necessarily required to detect these typical colors. For example, the pixels of the imaging unit of the present disclosure may output signals of intermediate colors of the colors described above, such as an emerald green signal. Moreover, the imaging unit according to the present disclosure may include white pixels for detecting visible light. For example, pixels each having no color filter layer 21 are available as white pixels.

Figure 9:
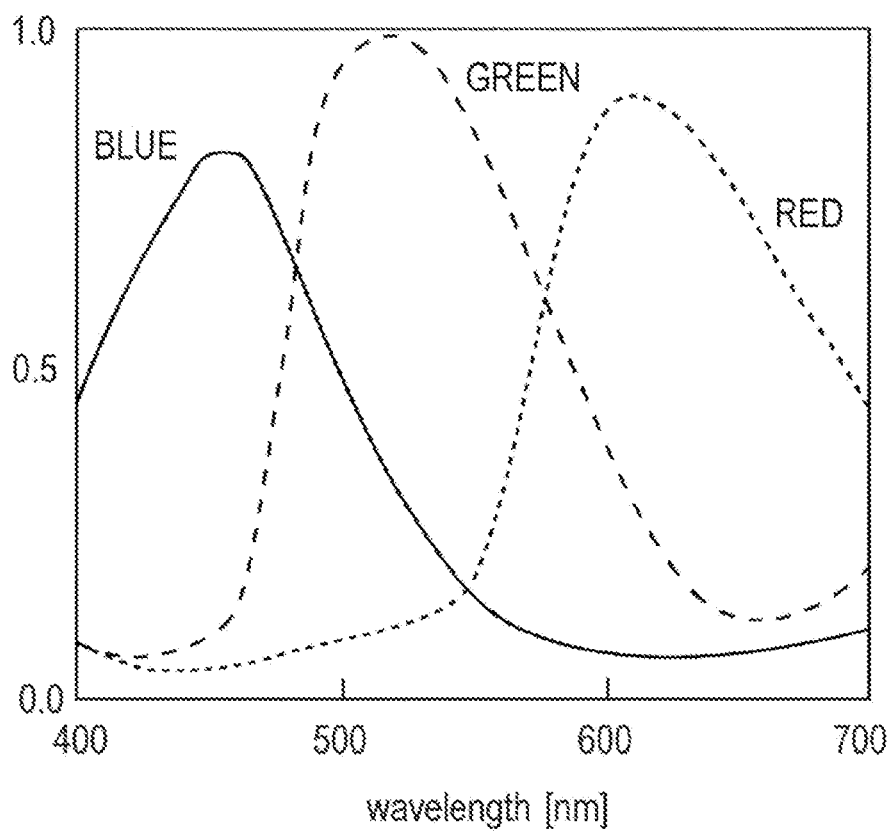
FIG. 9 is a graph presenting an example of spectral sensitivity characteristics of a red pixel, a green pixel, and a blue pixel.

A graph in FIG. 9 presents an example of spectral sensitivity characteristics of a red pixel, a green pixel, and a blue pixel. A horizontal axis in the graph of FIG. 9 represents wavelengths of light. Further, a vertical axis in the graph of FIG. 9 represents values of sensitivity normalized by 1. The red pixel, the green pixel, and the blue pixel each have a different characteristic. For example, the blue pixel has a characteristic exhibiting a peak around 465 nm. Moreover, the green pixel has a characteristic exhibiting a peak around 520 nm. Meanwhile, the red pixel has a characteristic exhibiting a peak around 610 nm. Each of the pixels has high sensitivity, to a wavelength band around the corresponding peak. The spectral sensitivity characteristics of the pixels in FIG. 9 are presented only by way of example. Accordingly, use of a red pixel, a green pixel, or a blue pixel each having a spectral sensitivity characteristic different from the corresponding characteristic presented in the figure is not excluded.

Figure 10:
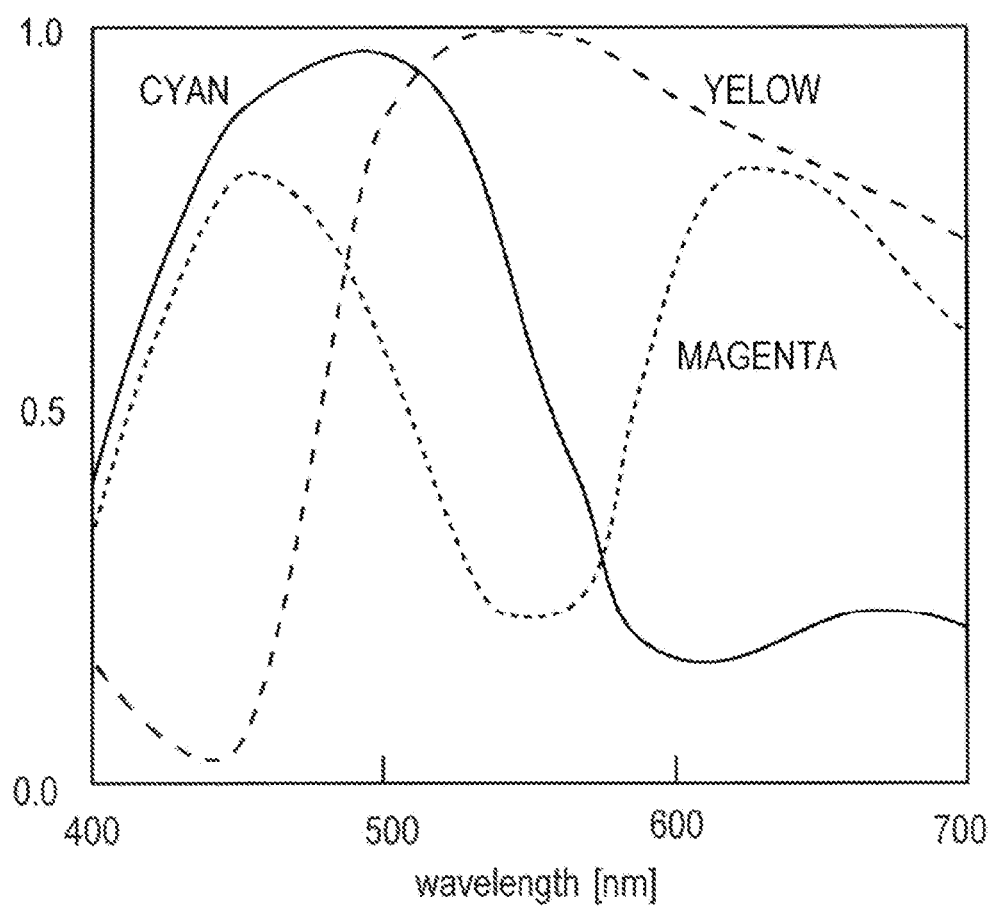
FIG. 10 is a graph presenting an example of spectral sensitivity characteristics of a cyan pixel, a yellow pixel, and a magenta pixel.

A graph in FIG. 10 presents an example of spectral sensitivity characteristics of a cyan pixel, a yellow pixel, and a magenta pixel. A horizontal axis in the graph of FIG. 10 represents wavelengths of light. Further, a vertical axis in the graph of FIG. 10 represents values of sensitivity normalized by 1. The cyan pixel, the yellow pixel, and the magenta pixel each have different characteristics. For example, the cyan pixel has relatively high spectral diffraction sensitivity in a band ranging from 450 to 530 nm. Accordingly, light in a range from blue to green is detectable by the cyan pixel. Meanwhile, the yellow pixel has relatively high spectral diffraction sensitivity in a band ranging from 520 to 600 nm. Accordingly, light in a range from green to red is detectable by use of the yellow pixel.

Referring to the spectral sensitivity characteristics of the magenta pixels, the magenta pixels reveal that there are two peaks in this characteristic. The magenta pixel has a first peak of sensitivity around a wavelength of 460 nm. Further, the magenta pixel has a second peak of sensitivity around a wavelength of 620 nm. Accordingly, both blue light and red light are detectable by use of the magenta pixel. The spectral sensitivity characteristics of the pixels in. FIG. 10 are presented only by way of example. Accordingly, use of a cyan pixel, a yellow pixel, or a magenta pixel each having a spectral sensitivity characteristic different from the corresponding characteristic presented in the figure is not excluded.

As described above, blue light is similarly detectable by use of pixels other than a typical blue pixel, such as a cyan pixel and a magenta pixel. It can be said that the blue pixel, the cyan pixel, and the magenta pixel are each a pixel having sensitivity to blue (blue light detection pixel). According to the electronic apparatus of the present disclosure, a ratio of the blue light detection pixels of the first imaging unit may be made higher than that of the second imaging unit to compensate for sensitivity of the first imaging unit (imaging unit 8) to the wavelength band including blue light. Moreover, according to the electronic apparatus of the present disclosure, the ratio of the blue light detection pixels of the first imaging unit may be made higher than 1/4 which is a value of that ratio of a Bayer array.

For example, as the blue light detection pixel, a pixel including a color filter having a light transmittance of 40% or higher in a wavelength band from 450 to 470 nm and a photoelectric conversion unit for detecting light transmitted by this color filter can be used. Moreover, as the blue light detection pixel, a pixel including a photoelectric conversion unit having quantum efficiency of 40% or higher in a wavelength band from 450 to 470 nm can be used. In this case, the photoelectric conversion unit may include an organic photoelectric conversion film, or may include a photodiode including an inorganic material. Note that the quantum efficiency refers to a ratio of conversion of a photon having entered the photoelectric conversion unit into an electron.

Note that the imaging unit may include a pixel that detects electromagnetic waves other than visible light as a detection target. For example, the imaging unit may use a filter that transmits light other than visible light, such as infrared light. Moreover, the imaging unit may include a photoelectric conversion unit that detects light other than visible light, such as infrared light. In This manner, the electronic apparatus can acquire depth information from the imaging unit and generate a range image.

Figure 11:
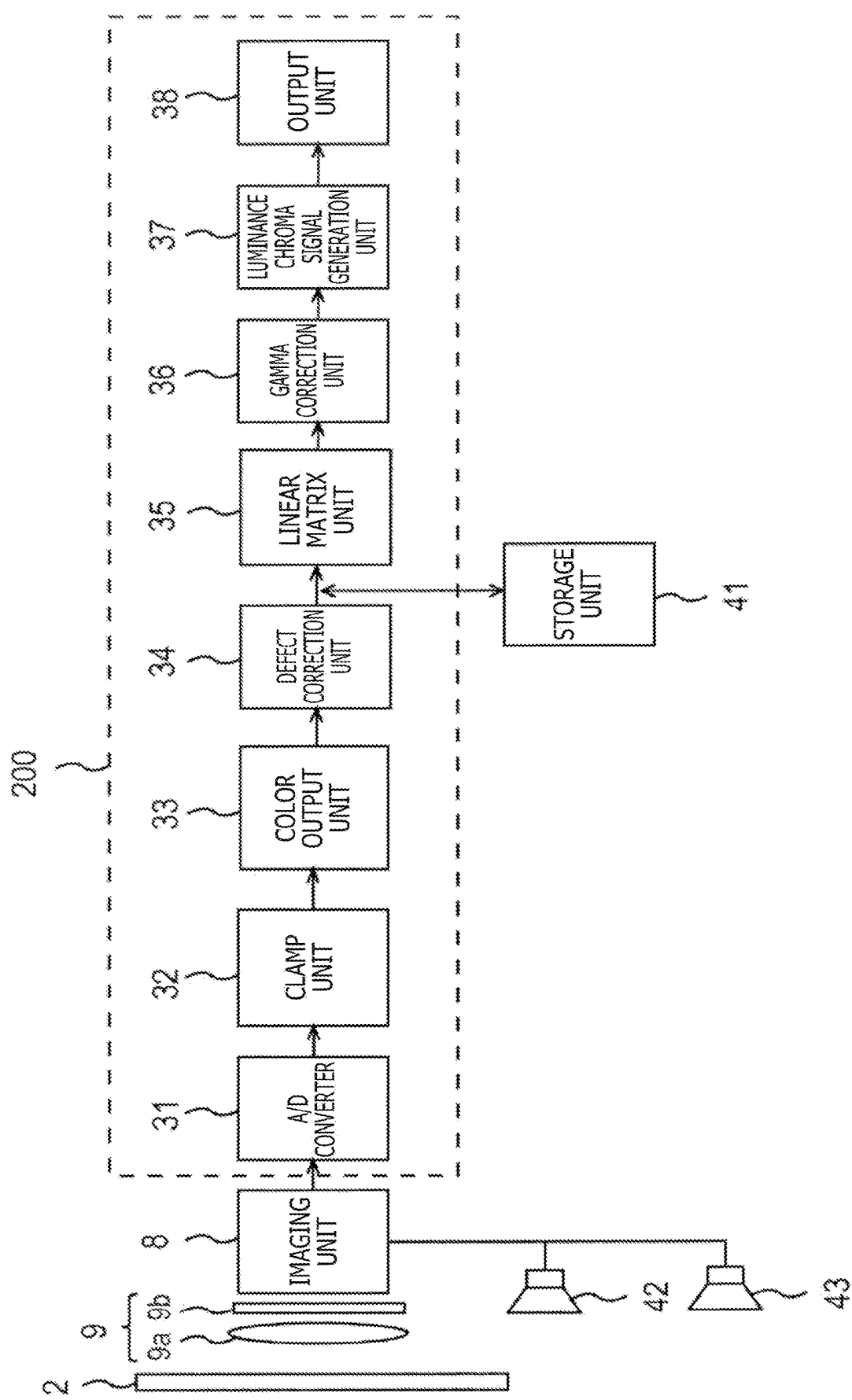
FIG. 11 is a block diagram depicting an internal configuration of the electronic apparatus according to the present embodiment.

FIG. 11 is a block diagram depicting an internal configuration of the electronic apparatus according to the present disclosure. The electronic apparatus in FIG. 11 includes the display unit 2, the optical system 9, the imaging unit 8, an A/D converter 31, a clamp unit 32, a color output unit 33, a defect correction unit 34, a linear matrix unit 35, a gamma correction unit 36, a luminance chroma signal generation unit 37, an output unit 38, a flash 42, a flash 43, and a storage unit 41. For example, the A/D converter 31, the clamp unit 32, the color output unit 33, the defect correction unit 34, the linear matrix unit 35, the gamma correction unit 36, the luminance chroma signal generation unit 37, and the output unit 38 can be mounted on a processing circuit 200.

For example, the optical system 9 includes one or more lenses 9a and an IR (Infrared Ray) cut filter 9b. However, the IR cut filter 9b may be omitted. As described above, the imaging unit 8 includes multiple pixels each performing photoelectric conversion and outputting a color signal.

The color signal output from each of the pixels is input to the A/D converter 31. The A/D converter 31 generates digital pixel data obtained by digitizing color signals of the multiple pixels.

The clamp unit 32 executes a process for specifying a black level. For example, the clamp unit 32 subtracts black level data from the digital pixel data. The data output from the clamp unit 32 is input to the color output unit 33. For example, the color output unit 33 classifies the digital pixel data into pieces of color information. For example, the defect correction unit 34 performs a correction process such as removable of noise components and correction of signal levels. For example, the noise components are flare components or diffraction light components. For example, the defect correction unit 34 may interpolate data regarding polarized pixels with use of digital pixel data of surrounding no-change pixels. However, there are no limitations on details of the correction process co be executed by the defect correction unit 34.

The linear matrix unit 35 performs matrix calculation for color information (e.g., RGB). In this manner, color reproducibility of images can be raised. The linear matrix unit 35 is also called a color matrix unit. For example, an imaging unit including at least any of a cyan pixel, a yellow pixel, or a magenta pixel is assumed to be adopted. In this case, color information associated with at least any one of cyan, yellow, or magenta is input to the linear matrix unit 35. The linear matrix unit 35 can convert color information associated with at least any one of cyan, yellow, or magenta into color information in an RGB (Red/Green/Blue) system by performing matrix calculation.

The gamma correction unit 36 performs gamma correction for the color information output from the linear matrix unit 35. For example, the gamma correction unit 36 performs gamma correction according to display characteristics of the display unit 2 to improve visibility of a captured image on the display unit 2. The luminance chroma signal generation unit 37 generates a luminance chroma signal on the basis of output data from the gamma correction unit 36. The luminance chroma signal is a signal used for display on the display unit 2. The output unit 38 transfers image data to the display unit 2, etc.

Note that at least a part of signal processing performed by the defect correction unit 34, the linear matrix unit 35, the gamma correction unit 36, or the luminance chroma signal generation unit 37 in FIG. 11 may be executed by a logic circuit included in the imaging sensor including the imaging unit 8. Moreover, at least a part of the above signal processing may be executed by a signal processing circuit included in the electronic apparatus 1. Note that the electronic apparatus according to the present disclosure may perform other types of processing such as an exposure adjustment process and an edge emphasis process.

The storage unit 41 is a memory or a storage capable of storing data of images captured by the imaging unit 8. For example, the memory is a volatile memory such as a SRAM and a DRAM, or a non-volatile memory such as a NAND flash memory and a NOR flash memory. For example, the storage is a hard disk or an SSD. However, the memory or the storage used as the storage unit 41 is not limited to any type. For example, the linear matrix unit 35 is allowed to perform image synthesis or correction for multiple images stored in the storage unit 41. However, a constituent element other than the linear matrix unit 35 may synthesize or correct the images.

The flash 42 is a light source which applies light to an object in linkage with an imaging operation performed by the imaging unit 8. For example, a white LED can be used as the flash 42. However, the light source to be used as the flash 42 is not limited to any type.

The flash 43 is a light source which applies blue light to the object in linkage with the imaging operation performed by the imaging unit 8. For example, a blue LED can be used as the flash 43. However, the light source to be used as the flash 43 is not limited to any type. For example, as the flash 43, a light source capable of applying light having a higher color temperature than that of the flash 44 disposed on the opposite side of the electronic apparatus 1 can be used.

Note that each of the flash 42, the flash 43, and the storage unit 41 described above is an optional constituent element. Accordingly, at least any of these constituent elements may be omitted.

Figure 12:
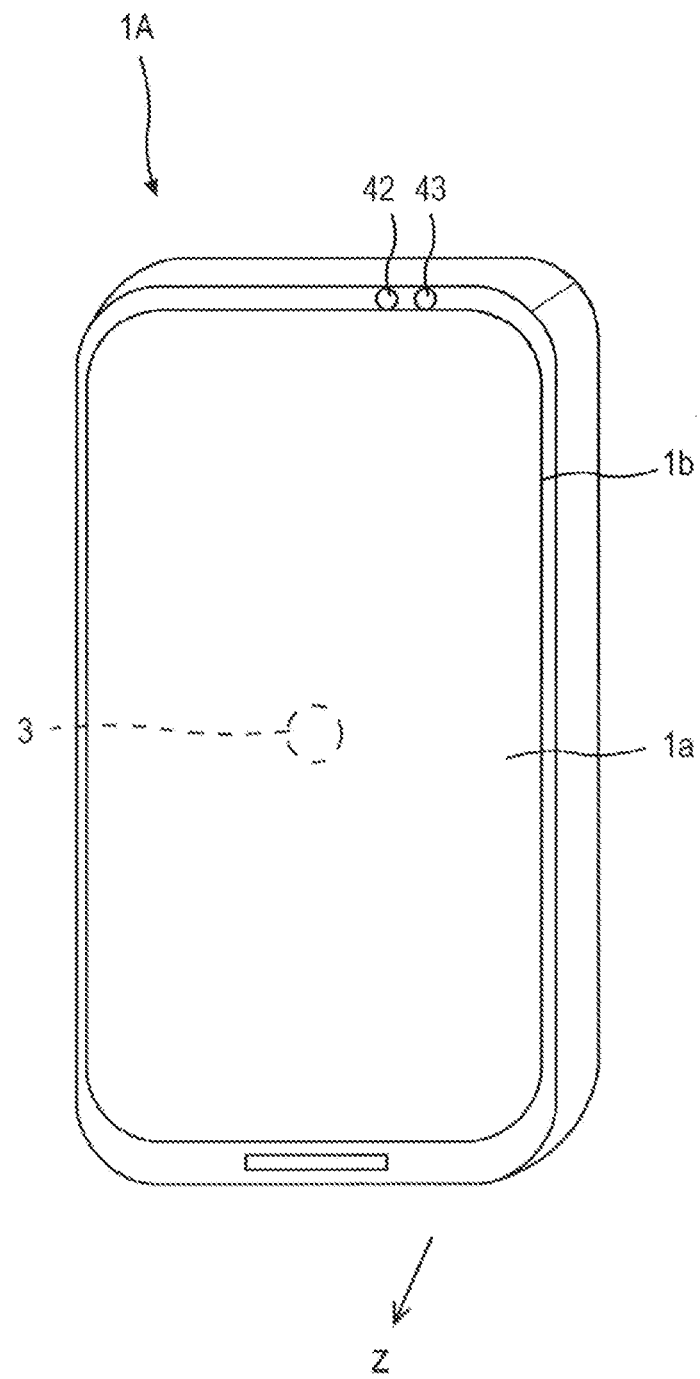
FIG. 12 is a schematic external diagram of an electronic apparatus according to modification 1.

FIG. 12 is a schematic external diagram of an electronic apparatus according to modification 1. An electronic apparatus 1A in FIG. 12 is produced by the flash 42 and the flash 43 being added to the electronic apparatus 1 in FIG. 2. The flash 42 and the flash 43 are disposed on substantially the same plane as the display screen 1a of the electronic apparatus 1A.

According to the example of FIG. 12, the flash 42 and the flash 43 are disposed on the bezel 1lb. However, the flash 42 and the flash 43 may be disposed at positions different from the positions depicted in the figure. For example, at least either the flash 42 or the flash 43 may be a flash externally attached to the electronic apparatus. Moreover, the display unit 2 may be controlled such that the display screen 1a emits light during imaging by the camera module 3. In this case, it can be said that the display unit 2 also functions as the flash 42 and the flash 43. Moreover, at least either the flash 42 or the flash 43 may be mounted at a position on the rear side of the display screen 1a when the display screen 1a is viewed from the front. Note that the configuration of the electronic apparatus 1A in FIG. 12 is similar to the configuration of the electronic apparatus 1 in FIG. 2 except for the point that the flash 42 and the flash 43 are added.

As will be described below, the flash 43 applies blue light to an object to compensate for sensitivity to a wavelength band including blue light. Note that the flash 42 and the flash 43 may each be controlled by a hardware circuit, or by software operating in the electronic apparatus 1.

Described hereinafter will be an example of a pixel array adopted by the first imaging unit (imaging unit 8) which performs imaging with use of light having passed through the display unit 2. In this example, X (X: color name) of an X pixel indicates a wavelength band corresponding to a detection target of each pixel. For example, the X pixel detects light in a wavelength band including any of colors. Moreover, the name of the X pixel is not intended to limit implementation of the pixel. The implementation of pixels herein refers to presence or absence of the color filter, the type of the photoelectric conversion unit, and presence or absence of vertical spectral diffraction, for example. Accordingly, pixels that detect the same color as a detection target can be implemented using multiple methods.

In a case where sensitivity of the imaging unit 8 to the wavelength band including blue light is desired to be made higher than that of an imaging unit adopting a Bayer array, a ratio of blue light detection pixels included in all pixels can be raised to a value larger than ¼ which is the ratio of the Bayer array. For compensating for the sensitivity to the wavelength band including blue light, the ratio of the blue light detection pixels in the imaging unit 8 (first imaging unit) may be set to a value larger than that ratio of the imaging unit 8A (second imaging unit).

Figure 13:
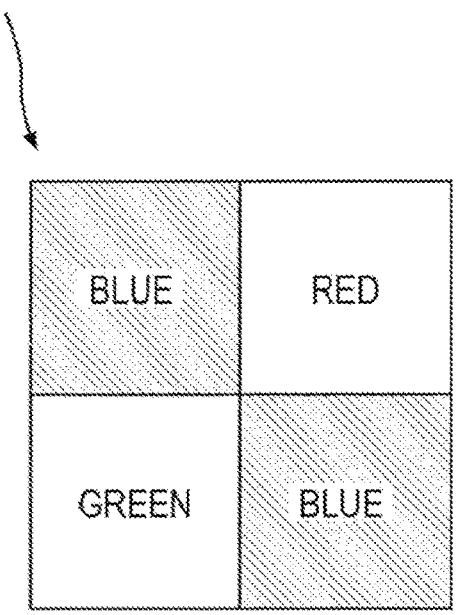
FIG. 13 is a plan diagram depicting an example of a pixel array of a first imaging unit.

FIG. 13 depicts a pixel array 100 including red pixels, green pixels, and blue pixels at a ratio of 1:1:2. The imaging unit 8 may adopt an array formed such that a ratio of blue pixels included in all pixels becomes higher than a ratio of green pixels. The ratio of the blue light detection pixels in all the pixels is ½ in the pixel array 100. Accordingly, sensitivity to the wavelength band including blue light is allowed to become higher than that of a Bayer array. Sensitivity to the wavelength band including blue light is dependent mainly on a ratio of blue light detection pixels of an imaging unit. Accordingly, the arrangement order and the arrangement regularity of the pixels in the pixel array may be different from those in the example of FIG. 13.

Figure 14:
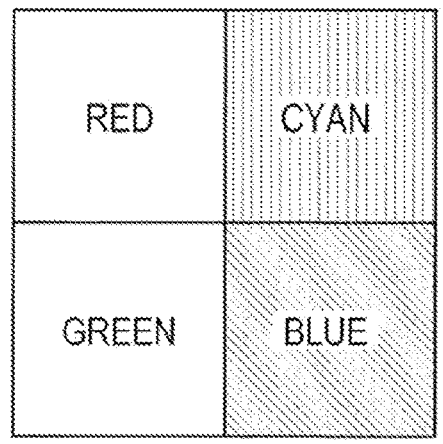
FIG. 14 is a plan diagram depicting an example of the pixel array of the first imaging unit.

FIG. 14 depicts a pixel array 101 where some of green pixels in a Bayer array are replaced with cyan pixels. As depicted in FIG. 10, a cyan pixel has high sensitivity to light in a wavelength band ranging from blue to green. In the pixel array 101, the cyan pixel and the blue pixel each correspond to a blue light detection pixel. Accordingly, a ratio of blue light detection pixels in all pixels is ½ in the pixel array 101 as well. Accordingly, when the pixel array 101 is used, sensitivity to the wavelength band including blue light is allowed to become higher than that of a Bayer array. Note that the arrangement order and the arrangement regularity of the pixels in the pixel array may be different from those in the example of FIG. 14.

Figure 15:
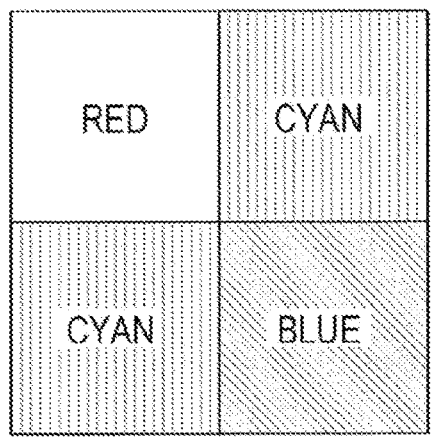
FIG. 15 is a plan diagram depicting an example of the pixel array of the first imaging unit.

FIG. 15 depicts a pixel array 102 where all of green pixels in a Bayer array are replaced with cyan pixels. The ratio of the blue light detection pixels in all the pixels is ¾ in the pixel array 102. Accordingly, sensitivity to the wavelength band including blue light is allowed to become further higher than that of the pixel array 101. The pixel array 102 does not include green pixels. However, even in the case of use of the pixel array 102, green color information can be generated by signal processing. For example, the linear matrix unit 35 can subtract blue color information from cyan color information to obtain green color information (see FIGS. 9 and 10). The arrangement order and the arrangement regularity of the pixels in the pixel array may be different from those in the example of FIG. 15.

Figure 16:
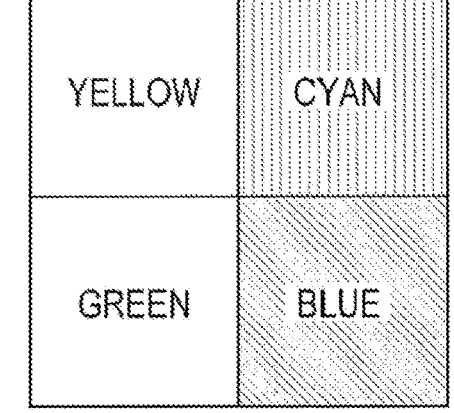
FIG. 16 is a plan diagram depicting an example of the pixel array of the first imaging unit.

FIG. 16 depicts a pixel array 103 where red pixels in the pixel array 101 in FIG. 14 are replaced with yellow pixels. In the pixel array 101 depicted in FIG. 14, some of green pixels in a Bayer array are replaced with cyan pixels. Accordingly, the level of the green color signals lowers in comparison with the level of the red color signals. As such, the red pixels can be replaced with yellow pixels to maintain a balance between the red and green color signals. The pixel array 103 does not include red pixels. However, red color information can be generated by signal processing. For example, the linear matrix unit 35 can subtract green color information from yellow color information to obtain red color information (see FIGS. 9 and 10). The arrangement order and the arrangement regularity of the pixels in the pixel array may be different from those in the example of FIG. 16.

Figure 17:
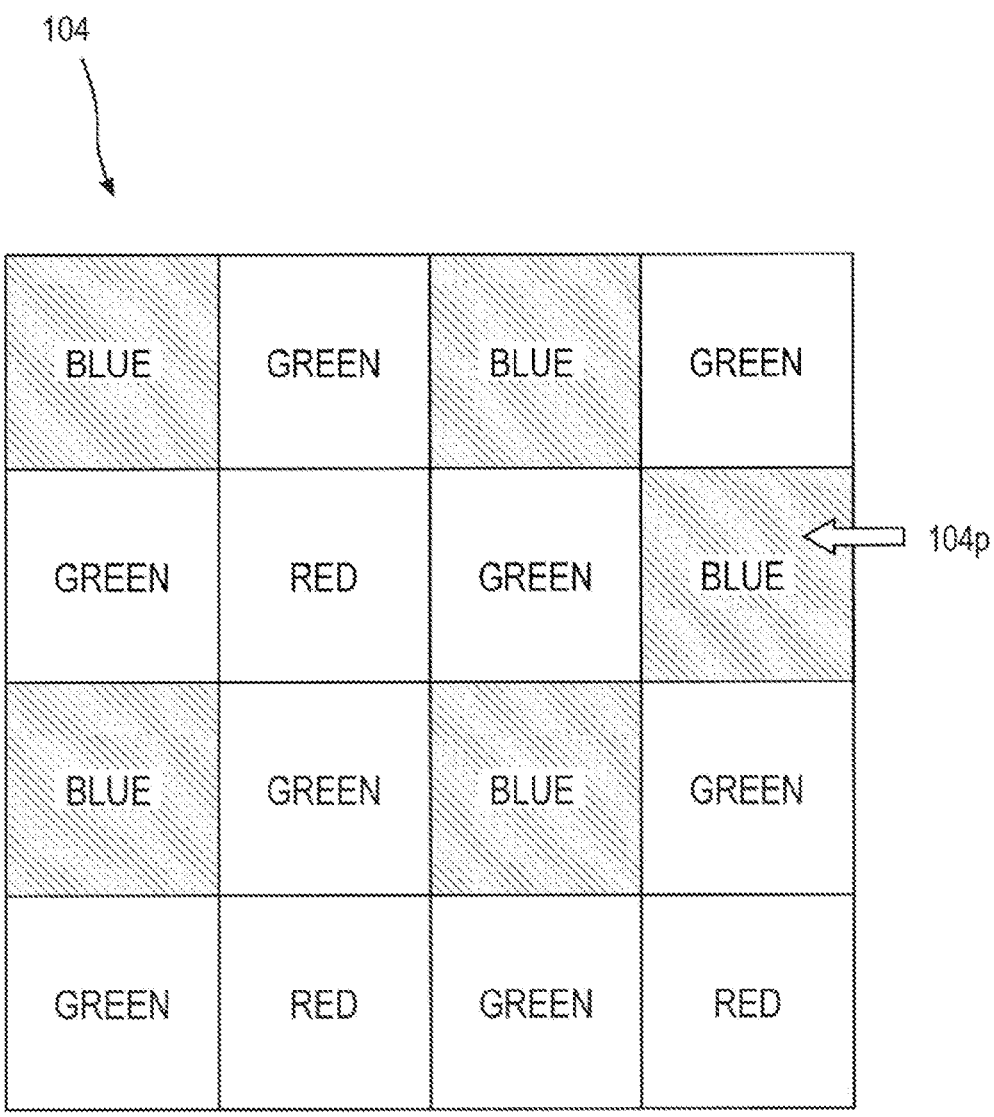
FIG. 17 is a plan diagram depicting an example of the pixel array of the first imaging unit.

FIG. 17 depicts a pixel array 104 where some of red pixels in a Bayer array are replaced with blue pixels. In the pixel array 104 in FIG. 17, a pixel 104p which is one of four red pixels included in a 4×4 array is replaced with a blue pixel. In the pixel array 104, a ratio of blue light detection pixels included in all pixels is 5/16, which is a larger value than ¼ as a corresponding ratio in a Bayer array. Accordingly, when the pixel array 104 is used, sensitivity to the wavelength band including blue light is allowed to become further higher than that sensitivity of a Bayer array. Note that the arrangement order and arrangement regularity of the pixels in the pixel array may be different from those in the example of FIG. 17.

As described above, sensitivity to the wavelength band including blue light in the first imaging unit may be raised by replacing at least either green pixels or red pixels in a Bayer array with pixels of a color having a shorter wavelength.

Note that the pixel array of the first imaging unit (imaging unit 8) may be produced by repeating an array of 2×2. Moreover, the pixel array of the first imaging unit according to the present disclosure may be produced by repeating an array of 4×4. However, there are no limitations on the size and the shape of the array corresponding to a minimum unit for specifying the pixel array. For example, the pixel array of the first imaging unit may be produced by repeating a linear array, an shaped array, or a rectangular array.

Figure 18:
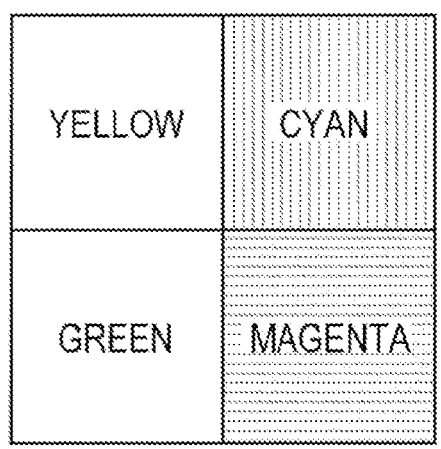
FIG. 18 is a plan diagram depicting an example of the pixel array of the first imaging unit.

FIG. 18 depicts a pixel array 105 using complementary colors of three primary colors (RGB) of light. The pixel array 105 in FIG. 18 includes green pixels, yellow pixels, cyan pixels, and magenta pixels at a ratio of 1:1:1:1. As presented in the graph of FIG. 10, the cyan pixel and the magenta pixel are each a blue light detection pixel having high sensitivity to a wavelength band including blue light. Accordingly, a ratio of blue light detection pixels in all pixels in the pixel array 105 is ½, which is a larger value than ¼ as a corresponding ratio in a Bayer array. Accordingly, when the pixel array 104 is used, sensitivity to the wavelength band including blue light is allowed to become further higher than that sensitivity of a Bayer array. Note that the arrangement order and the arrangement regularity of the pixels in the pixel array may be different from those in the example of FIG. 18.

Note that RGB color information can be generated even in a case where the imaging unit 8 (first imaging unit) uses the pixel array 105. For example, the linear matrix unit 35 can subtract green color information from cyan color information and perform correction according to magenta color-information to generate blue color information. Moreover, the linear matrix unit 35 can subtract green color information from yellow color information to generate red color information. Note that the linear matrix unit 35 may correct red color information with use of a value of magenta color information.

The electronic apparatus according to the present disclosure may include a display unit disposed on a first surface, a first imaging unit disposed on the side opposite to a display surface of the display unit, and a second imaging unit disposed on a second surface on the side opposite to the first surface. Sensitivity of the first imaging unit to a first wavelength band including blue light can be made higher than that of the second imaging unit. For example, a ratio of blue light detection pixels of a pixel array of the first imaging unit may be made higher than that of the second imaging unit. The first imaging unit may receive light having passed through the display unit.

Moreover, the electronic apparatus according to the present disclosure may include the display unit disposed on the first surface and a first imaging unit that is disposed on the side opposite to the display surface of the display unit and that includes multiple pixels for photoelectrically converting light having entered via the display unit. In this case, a ratio of blue light detection pixels of the multiple pixels may be made higher than ¼.

The blue light detection pixels may include at least any of a blue pixel, a magenta pixel, and a cyan pixel. However, the blue light detection pixels are not limited to these pixels. As described above, the first imaging unit may include at least any of a cyan pixel, a magenta pixel, and a yellow pixel. Moreover, the first imaging unit may have a pixel array where at least either green pixels or red pixels in a Bayer array are replaced with pixels of a color having a shorter wavelength.

Each pixel of the imaging unit (first imaging unit and second imaging unit) according to the present disclosure may include one photoelectric conversion unit (light reception surface). Alternatively, each pixel of the imaging unit according to the present disclosure may include multiple photoelectric conversion units (light reception surfaces). For example, in a case where a vertical spectral diffraction type imaging unit is adopted, multiple photoelectric conversion units of each pixel are arranged in a depth (z-axis) direction of a substrate. Accordingly, each pixel of the vertical spectral diffraction type imaging unit has multiple photoelectric conversion units for detecting light in different wavelength bands. An example of a pixel having multiple photoelectric conversion units will be described with reference to FIG. 19.

In the following description, each of surfaces where the photoelectric conversion units receive light is referred to as a light reception surface.

Figure 19:
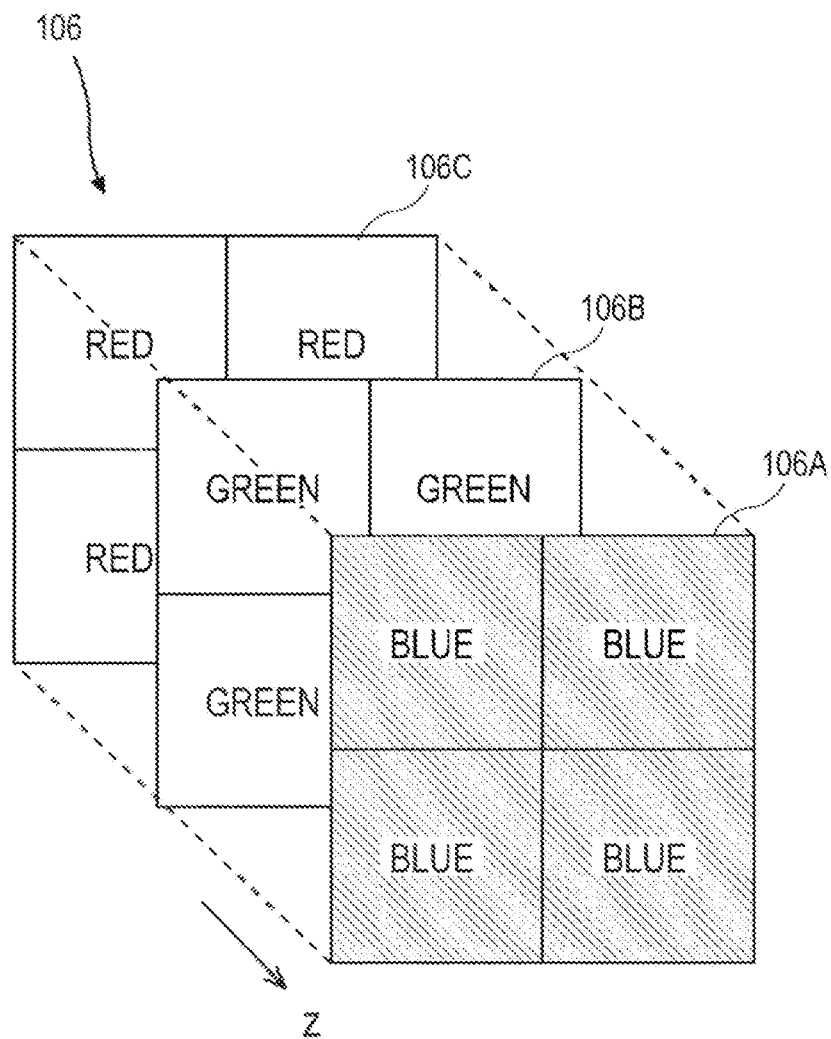
FIG. 19 is a plan diagram depicting an example of the pixel array of the first imaging unit.

FIG. 19 depicts an example of a pixel array included in a vertical spectral diffraction type first imaging unit. According to a pixel array 106 in FIG. 19, multiple photoelectric conversion units are disposed in a depth direction of a substrate. Accordingly, each pixel has multiple light reception surfaces. The pixel array 106 includes three light reception surfaces, i.e., light reception surfaces 1061, 106B, and 106C, in this order from the upper side (z-axis positive direction side). The light reception surface 106A is capable of detecting a wavelength band including blue light. The light reception surface 106B located below the light reception surface 106A is capable of detecting a wavelength band including green light. In addition, the light reception surface 106C located below the light reception surface 106B is capable oil detecting a wavelength band including red light. Note that there are no limitations on the depths within the imaging unit where the light reception surfaces 106A, 106B, and 106C are formed.

In the pixel array 106, each pixel has a light reception surface capable of detecting a wavelength band including blue light. Accordingly, it can be said that in the pixel array 106, blue light detection pixels are disposed on the entire surface. Similarly, in the pixel array 106, each pixel has a light reception surface capable of detecting a wavelength band including red light and a light reception surface capable of detecting a wavelength band including blue light. Accordingly, it can be said that in the pixel array 106, red pixels and green pixels are disposed on the entire surface. When the pixel array 106 as used, it as possible to compensate for sensitivity to the wavelength band including blue light and to secure at the same time sensitivity to light in the other wavelength bands.

The wavelength bands corresponding to detection targets for the respective light reception surfaces depicted in. FIG. 19 are presented only by way of example. For example, the wavelength band including blue light may be detected using the light reception surface 106B or 106C. Moreover, light in a wavelength band different from the above bands may be detected at the light reception surfaces. For example, light in a wavelength band corresponding to magenta, cyan, or yellow may be detected using at least any one of the above light reception surfaces. In the pixel array 106, light in a specified wavelength band is detected at each of the light reception surfaces. Accordingly, all pixels of the light reception surface 106A in FIG. 19 are "BLUE." However, light in wavelength bands different for each pixel may be detected even within the same light reception surface. For example, different types of photoelectric conversion units can be formed at the same depth within the substrate. Note that an example of an imaging unit performing vertical spectral diffraction will be described below.

Moreover, the electronic apparatus according to the present disclosure may perform imaging multiple times with use of different types of flashes to achieve image synthesis and image correction. An example of a case where the electronic apparatus 1A in FIG. 12 is used will hereinafter be described.

Figure 20:
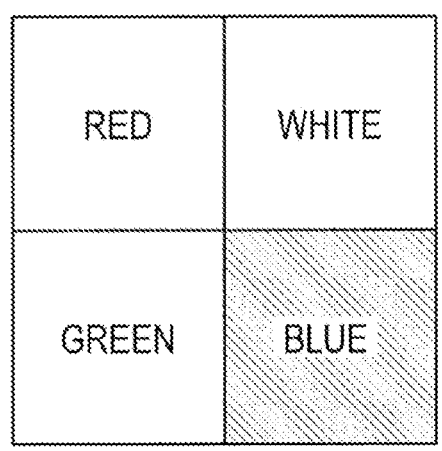
FIG. 20 is a plan diagram depicting an example of the pixel array of the first imaging unit.

FIG. 20 depicts an example of a pixel array used in a case where imaging is performed multiple times with use of different types of flashes. A pixel array 107 in FIG. 20 includes red pixels, green pixels, blue pixels, and white pixels at a ratio of 1:1:1:1. The arrangement order of the pixels in the array may be different from that in the example in FIG. 20. For example, the white pixels are pixels in which color filters above photoelectric conversion units are omitted.

For example, the electronic apparatus 1A applies blue light to an object with use of the flash 43 during the first imaging. At this time, the white pixels operate substantially as blue pixels. Accordingly, sensitivity for detecting light in a wavelength band including blue can be raised. An image (first image) that is captured by the electronic apparatus 1A in the first imaging and that emphasizes blue color information is stored in the storage unit 41.

Thereafter, the electronic apparatus 1A applies white light to an object with use of the flash 42 during the second imaging. At the second imaging, an image (second image) less emphasizing blue color information than the image captured in the first imaging can be obtained. Then, the linear matrix unit 35 can generate an image obtained by synthesizing the first image and the second image and by compensating for information regarding the blue color attenuated due to the display unit 2. Moreover, the linear matrix unit 35 may correct the second image with use of the first image, or may correct the first image with use of the second image. By combining images captured under different conditions to perform image processing, a high-quality still image can be obtained.

According to the case described above, the flash 43 (blue flash) is caused to emit light during the first imaging, and the flash 42 (white flash) is caused to emit light during the second imaging. However, there is no limitation on the order of light emissions from the respective flashes. For example, the flash 42 (white flash) may be caused to emit light during the first imaging, and the flash 43 (blue flash) may be caused to emit light during the second imaging.

Figure 21:
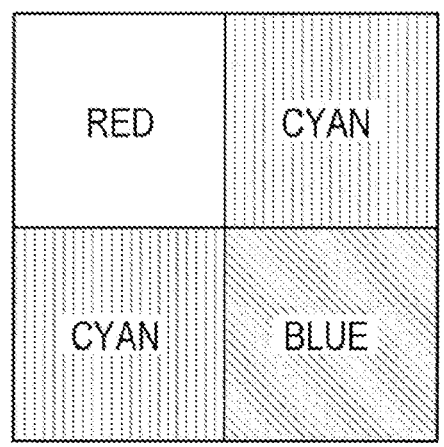
FIG. 21 is a plan diagram depicting an example of the pixel array of the first imaging unit.

Moreover, in a case where imaging is performed multiple times with use of different types of flashes to achieve image synthesis or correction, the imaging unit 8 (first imaging unit) may adopt a pixel array different from the pixel array 107 described above. For example, as in a pixel array 108 depicted in FIG. 21, an imaging unit including red pixels, cyan pixels, and blue pixels at a ratio of 1:2:1 may be used. The arrangement order of the pixels in the array may be different from the order in the example of FIG. 21.

As described above, the electronic apparatus according to the present disclosure may further include a first light source disposed on the first surface and configured to emit blue light during imaging by the first imaging unit. Moreover, the electronic apparatus according to the present disclosure may include a second light source disposed on the first surface and configured to emit white light during imaging of the first imaging unit, and a processing circuit configured to generate an image obtained by synthesizing a first image and a second image, the first image being captured by the first imaging unit during light emission from the first light source, the second image being captured by the first imaging unit during light emission from the second light source.

Further, the electronic apparatus according to the present disclosure may include the first light source disposed on the first surface and configured to emit light during imaging of the first imaging unit, the second imaging unit disposed on a second surface on the side opposite to the first surface, and a third light source disposed on the second surface and configured to emit light during imaging by the second imaging unit. In this case, a color temperature of the first light source may be higher than a color temperature of the third light source.

The flash 43 described above is an example of the first light source. In addition, the flash 42 is an example of the second light source. The flash 44 in FIG. 5 is an example of the third light source.

Figure 22:
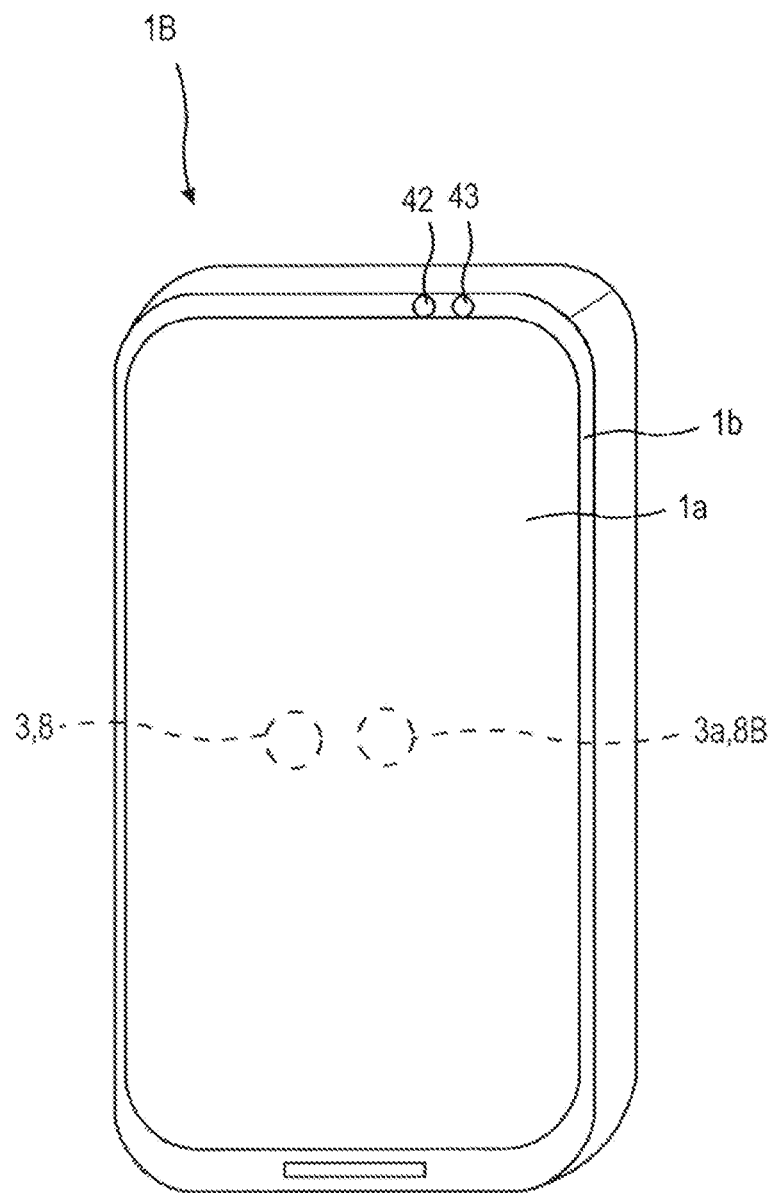
FIG. 22 is a schematic external diagram of an electronic apparatus according to modification 2.

FIG. 22 is a schematic external diagram of an electronic apparatus according to modification 2. An electronic apparatus 1B in FIG. 22 is produced by adding a camera module 3a to the electronic apparatus 1A in FIG. 12. Specifically, the electronic apparatus 1B includes the camera module 3 and the camera module 3a on the side opposite to the display screen 1a. The camera module 3 and the camera module 3a perform imaging with use of light having passed through the display unit 2. The camera module 3 includes the imaging unit 8 (first imaging unit) described above, and is capable of capturing an image in which sensitivity to a wavelength band including blue light attenuated due to the display unit 2 has been compensated for. For example, as described above, compensation for sensitivity to the wavelength band including blue light is achievable by raising the ratio of the blue light detection pixels in the pixel array of the imaging unit 8 to a ratio higher than that of a Bayer array.

On the other hand, the camera module 3a is a camera module that does not compensate for sensitivity particularly to a wavelength band including blue light, similarly to a camera module which performs imaging with use of light that has not passed through the display unit 2 (e.g., camera module 10 in FIGS. 5 and 6). For example, an imaging unit 8B of the camera module 3a includes a known pixel array such as a Bayer array including RGB. In such a manner, the electronic apparatus according to the present disclosure may include multiple imaging units on the side opposite to the display screen.

The electronic apparatus 1B depicted in FIG. 22 by way of example includes the flash 42 and the flash 43. However, at least either the flash 42 or the flash 43 may be omitted. It is assumed that the configuration of the display unit 2 of the electronic apparatus 1B is similar to the corresponding configuration of the electronic apparatus 1 described above.

Figure 23:
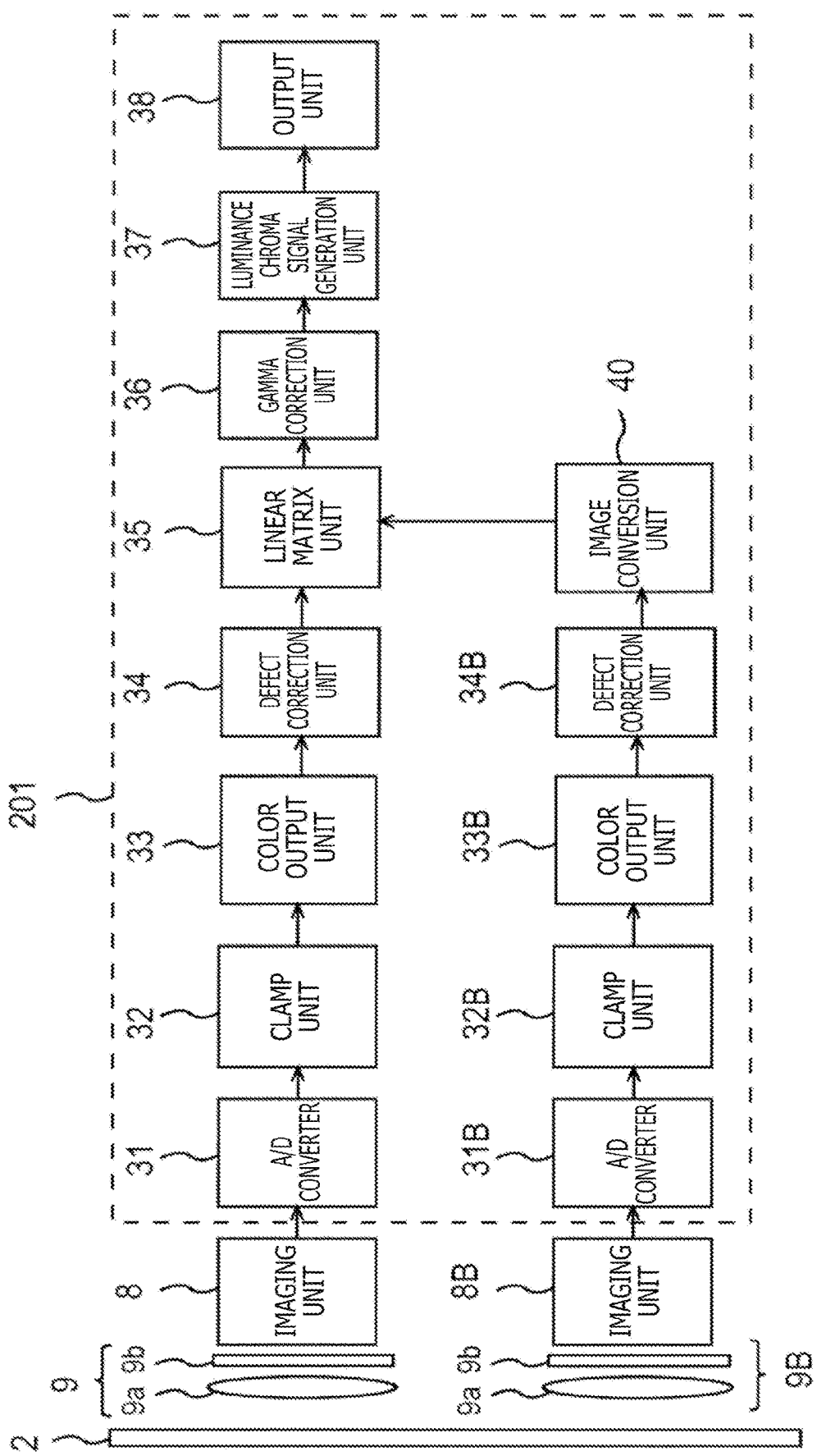
FIG. 23 is a block diagram depicting an internal configuration of the electronic apparatus according to modification 2.

A block diagram in FIG. 23 depicts an example of an internal configuration of the electronic apparatus 1B. The electronic apparatus 1B corresponds to an electronic apparatus produced by adding an optical system 9B, the imaging unit 8B, an A/D converter 31B, a clamp unit 32B, a color output unit 33B, a defect correction unit 34B, and an image conversion unit 40 to the configuration in FIG. 11. The optical system SB, the A/D converter 31B, the clamp unit 32B, the color output unit 33B, and the defect correction unit 34B corresponding to the camera module 3a are configured similarly to the optical system 9, the A/D converter 31, the clamp unit 32, the color output unit 33, and the defect correction unit 34, respectively. It is assumed that the configuration of the imaging unit 8B is similar to the configuration of the imaging unit 8 except for a pixel array included in the imaging unit 8B.

For example, the A/D converter 31, the clamp unit 32, the color output unit 33, the defect correction unit 34, the linear matrix unit 35, the gamma correction unit 36, the luminance chroma signal generation unit 37, the output unit 38, the A/D converter 31B, the clamp unit 32B, the color output unit 33B, the defect correction unit 34B, and the image conversion unit 40 can be mounted on a processing circuit 201.

The image conversion unit 40 performs image conversion in such a manner as to cancel disparity between an image (third image) captured by the imaging unit 8 and an image (fourth image) captured by the imaging unit 8B. For example, the image conversion unit 40 can cancel the disparity between the third image and the fourth image with use of various types of geometrical conversion algorithms. However, algorithm used by the image conversion unit 40 is not limited to any type. According to the block diagram of FIG. 23, image conversion is performed for the fourth image in such a manner as to cancel the disparity between the fourth image and the third image. However, the image conversion unit 40 may perform image conversion for the third image. Alternatively, the image conversion unit 40 may perform image conversion for both the images. The image conversion unit 40 may designate either the third image or the fourth image as a reference image.

In addition, the linear matrix unit 35 can generate a fifth image by synthesizing data of the fourth image and data of the third image output from the image conversion unit 40. The fourth image is an image in which sensitivity to blue light has been compensated for. The third image is available as an image for securing sufficient resolution. The linear matrix unit 35 can generate an image which accurately expresses colors while preventing deterioration of resolution, by using images captured by both the imaging units.

Note that in FIG. 23, the flash 42, the flash 43, and the storage unit 41 are omitted. These constituent elements may be omitted in the electronic apparatus 1B. Moreover, the electronic apparatus 1B may include at least any of these constituent elements.

As described above, the electronic apparatus according to the present disclosure may further include a third imaging unit that is disposed on the side opposite to the display surface of the display unit and that has lower sensitivity to the first wavelength band than that of the first imaging unit, and a processing circuit configured to form an image by synthesizing a third image captured by the first imaging unit and a fourth image captured by the third imaging unit.

Figure 24:
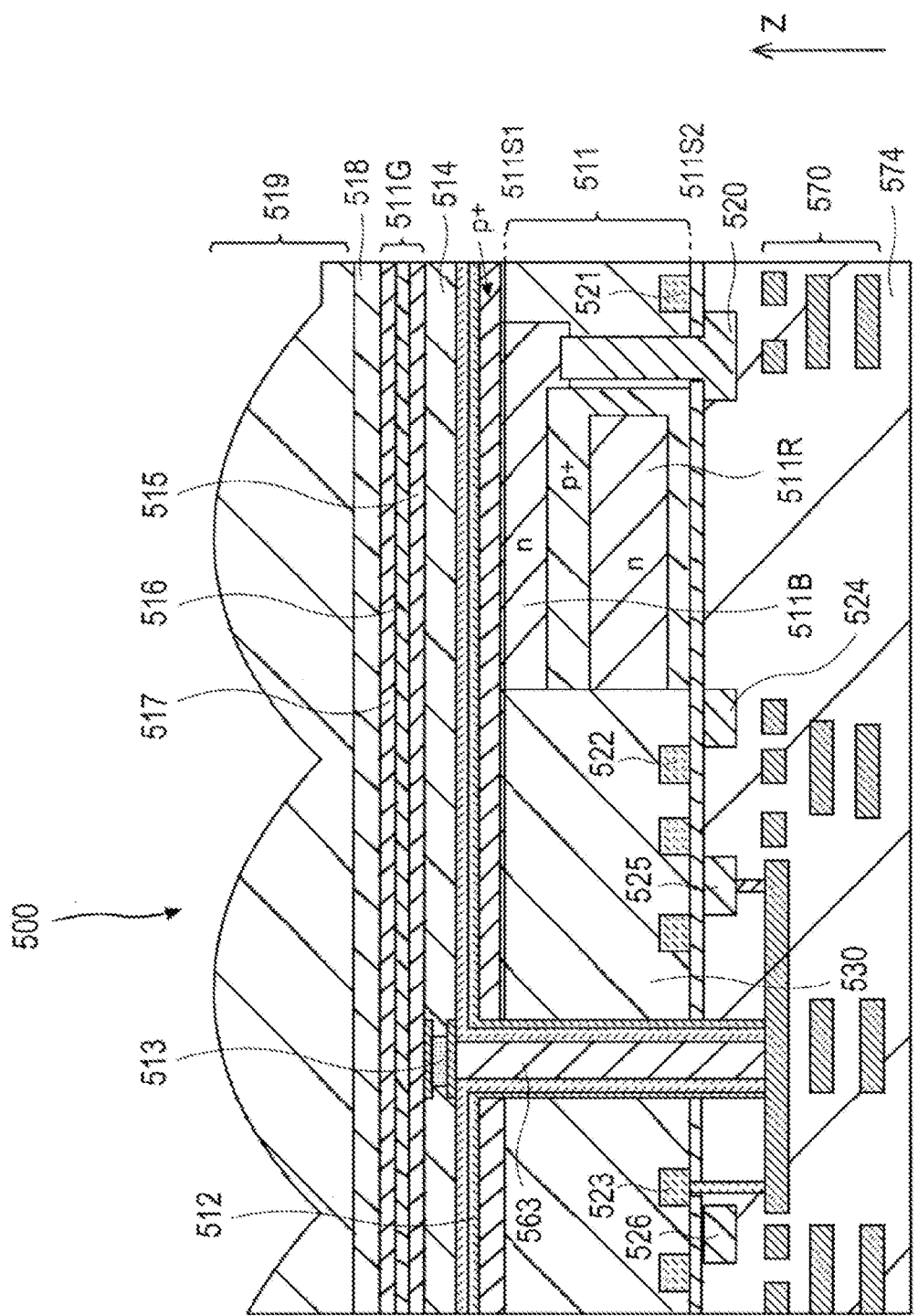
FIG. 24 is a cross-sectional diagram depicting an example of a vertical spectral diffraction type imaging unit.

FIG. 24 is a cross-sectional diagram depicting an example of the imaging unit according to modification 1. FIG. 24 depicts an imaging unit 500 capable of obtaining multiple color signals without using a color filter. The imaging unit 500 is a vertical spectral diffraction type imaging unit, and is disposed such that multiple photoelectric conversion units designating different wavelength ranges in the z-axis direction as detection targets are laminated on each other. It is assumed in the following description that a z-axis positive direction is referred to as "upper" and that a z-axis negative direction is referred to as "lower."

An organic photoelectric conversion unit 511G is provided on the rear surface side (upper side) of the semiconductor substrate. On the other hand, inorganic photoelectric conversion units 511B and 511R are laminated in a thickness direction (z-axis direction) of a semiconductor substrate 511. For example, each of the inorganic photoelectric conversion units 511B and 511R can be embedded in the semiconductor substrate 511.

For example, the organic photoelectric conversion layer 516 includes bulk-heterojunction structure of a p-type semiconductor and an n-type semiconductor (p/n unction surface) including an organic semiconductor material. For example, the semiconductor substrate 511 is an n-type silicon substrate. A surface 511S1 of the semiconductor substrate 511 corresponds to a surface facing in a light entrance direction of the semiconductor substrate 511. On the other hand, a surface 511S2 of the semiconductor substrate 511 corresponds to an opposite side surface with respect to the light entrance direction of the semiconductor substrate 511. For example, a p-well, a floating diffusion layer, a transistor, etc., can be formed in the semiconductor substrate 511. Wiring layers 570 can be formed in an insulation layer 574.

For example, a PIN-type photodiode is available as each of the inorganic photoelectric conversion units 511B and 511R. In this case, each of the inorganic photoelectric conversion units 511B and 511R has a pn-junction at a different depth (z-coordinates) of the semiconductor substrate 511. An absorbed wavelength band of electromagnetic waves varies for each depth of a silicon substrate. Accordingly, light in different wavelength bands is detectable by the inorganic photoelectric conversion units disposed at different depths within the semiconductor substrate 511.

The inorganic photoelectric conversion unit 511B is disposed at a depth where photoelectric conversion of blue light (e.g., wavelength ranging from 450 to 495 nm) is achievable. On the other hand, the inorganic photoelectric conversion unit 511R is disposed at a depth where photoelectric conversion of red light (e.g., wavelength ranging from 620 to 750 nm) is achievable. Accordingly, a blue color signal is output from the inorganic photoelectric conversion unit 511B. A red color signal is output from the inorganic photoelectric conversion unit 511R.

Each of the inorganic photoelectric conversion units 511B and 511R includes a hole accumulation layer (p-region in FIG. 24) and an electron accumulation layer (n-region in FIG. 24). The electron accumulation layer of the inorganic photoelectric conversion unit 511B is connected to a transistor 520. The hole accumulation layer of the inorganic photoelectric conversion unit 511B is bent along the transistor 520, and is connected to the hole accumulation layer of the inorganic photoelectric conversion unit 511R.

A p-well 530, floating diffusion layers 521 to 523, and transistors 520 and 524 to 526 are formed along the surface 511S2 of the semiconductor substrate 511. The transistor 520 is configured in such a manner as to transfer a signal charge of the inorganic photoelectric conversion unit 511B to the floating diffusion layer 521. The transistor 524 is configured in such a manner as to transfer a signal charge of the inorganic photoelectric conversion unit 511R to the floating diffusion layer 522.

The transistor 525 is configured in such a manner as to convert a charge Generated in the organic photoelectric conversion unit 511G into a voltage signal. The transistor 526 is configured in such a manner as to reset a charge transferred from the organic photoelectric conversion unit 511G to the floating diffusion layer 523.

A contact 513 includes a conductive material such as various types of metal or doped silicon.

The organic photoelectric conversion unit 511G includes an upper electrode 517, an organic photoelectric conversion layer 516, and a lower electrode 515. For example, the upper electrode 517, the organic photoelectric conversion layer 516, and the lower electrode 515 can be formed in this order as the layers in the organic photoelectric conversion unit 511G. However, there is no limitation on the order of formation of the layers in the organic photoelectric conversion unit 511G. For example, the lower electrode 515 is formed discretely for each of the imaging units 500. On the other hand, the organic photoelectric conversion layer 516 and the lower electrode 515 may each constitute a common connection layer shared by multiple imaging units 500.

For example, the organic photoelectric conversion layer 516 includes at least either a p-type semiconductor or an n-type semiconductor. In a case where the organic photoelectric conversion layer 516 includes both an organic photoelectric conversion material as a p-type semiconductor and an organic photoelectric conversion material as an n-type semiconductor, a material that transmits visible light can be selected as one of these materials, and a material that photoelectrically converts light in a particular wavelength range can be selected as the other material. Alternatively, the organic photoelectric conversion layer 516 may include three types of materials, a material that photoelectrically converts light in a particular wavelength range (light absorber), an n-type semiconductor having transmissibility to visible light, and a p-type semiconductor having transmissibility to visible light. For example, the n-type semiconductor functions as an electron transportation material of the organic photoelectric conversion layer 516. In addition, the p-type semiconductor functions as a hole transportation material of the organic photoelectric conversion layer 516.

For example, as the organic photoelectric conversion layer 516, an organic semiconductor material such as sub-phthalocyanine, fullerene C60, fullerene C70, or derivatives of these can be used. However, there are no limitations on types or combinations of the materials to be used as the organic photoelectric conversion layer 516.

For example, the lower electrode 515 and the upper electrode 517 are each a conductive film exhibiting light transmissibility. For example, each of the lower electrode 515 and the upper electrode 517 can include, as its material, metallic oxide such as ITO, IZO, IFO, ATO, and FTO. However, there are no limitations on the materials of the lower electrode 515 and the upper electrode 517.

An insulation layer 512 and an insulation layer 514 are formed between the surface 511S1 of the semiconductor substrate 511 and the lower electrode 515 of the organic photoelectric conversion unit 511G. For example, the insulation layer 514 and the insulation layer 512 can be sequentially formed on the lower electrode 515. A fixed charge layer and an insulating dielectric layer may be alternately laminated within the insulation layer 512. Moreover, a protection layer 518 is formed between an on-chip lens layer 519 and the upper electrode 517 of the organic photoelectric conversion unit 511G. For example, the on-chip lens 519 includes on-chip lenses and a flattening layer.

The protection layer 518 includes a material exhibiting light transmissibility. For example, the protection layer 518 is a single layer film including at least any one of silicon oxide, silicon nitride, silicon oxynitride, and the like. Alternatively, the protection layer 518 may be a laminated film including two or more of these materials.

A fixed charge in the fixed charge layer included in the insulation layer 512 may be either positive or negative. For example, various types of metallic oxide or nitride are available as the fixed charge layer. For example, the dielectric layer within the insulation layer 512 includes silicon oxide, TEOS, or silicon nitride. However, there is no limitation on the material of the dielectric layer. Moreover, the fixed charge layer may be produced by laminating two or more types of films.

For example, the on-chip lens layer 519 covers the entire surface of the protection layer 516. Multiple on-chip lenses (micro-lenses) are provided on the surface of the on-chip lens layer 519. Each of the on-chip lenses concentrates incident light on each of the light reception surfaces of the organic photoelectric conversion unit 511G and the inorganic photoelectric conversion units 511B and 511R. According to the example in FIG. 24, wiring layers 570 are formed on the side of the surface 511S2 of the semiconductor substrate 511. Accordingly, the light reception surfaces of the organic photoelectric conversion unit 511G and the inorganic photoelectric conversion units 511B and 511R are allowed to be disposed close to each other. This arrangement decreases sensitivity variations between the colors, which are produced according to an F-number of each of the on-chip lenses.

A through electrode 563 is provided between the surface 511S1 and the surface 511S2 of the semiconductor substrate 511. The organic photoelectric conversion unit 511G is connected to the floating diffusion layer 523 and the transistor 525 via the through electrode 563. In this manner, a charge of the organic photoelectric conversion unit 511G can be transferred to a circuit in a following stage. In a case where the imaging unit 500 includes multiple organic photoelectric conversion units 511G, for example, the through electrode 563 can be prepared for each of the organic photoelectric conversion units 511G.

Wiring and contacts for connection are provided between the through electrode 563 and the floating diffusion layer 523 and between the through electrode 563 and the transistor 525. For example, the through electrode 563 has a substantially cylindrical shape. However, a through electrode having other shapes such as a tapered shape may be used. Note that the transistor 526 disposed near the floating diffusion layer 523 is configured to reset a charge accumulated in the floating diffusion layer 523.

The organic photoelectric conversion layer 516 absorbs light in a predetermined wavelength range to form pairs of an electron and a hole. A charge including electrons and holes shifts to a corresponding electrode by an inner electric field and diffusion generated and caused by a difference in the work function of the electrodes. For example, holes shift to the upper electrode 517. In this case, electrons shift to the lower electrode 515. However, the shift of the charge is controllably by applying a potential to a portion between the upper electrode 517 and the lower electrode 515.

In a case of use of the organic photoelectric conversion layer 516 that is a single layer, at least either a p-type semiconductor or an n-type semiconductor is available. In a case of use of both a p-type semiconductor and an n-type semiconductor, the two types of semiconductors may be mixed to form a hulk-hetero structure within the organic photoelectric conversion layer 516. Moreover, the organic photoelectric conversion layer 516 may further include a material that photoelectrically converts light in a particular wavelength range (light absorber).

The organic photoelectric conversion layer 516 may have a laminated structure. For example, a two-layer structure including a u-type semiconductor layer and an n-type semiconductor layer, a p-type semiconductor layer and a mixed layer (bulk-hetero layer), or an n-type semiconductor layer and a mixed layer (bulk-hetero layer) may be formed. A three-layer structure including a p-type semiconductor layer, a mixed layer (hulk-hetero layer), and an n-type semiconductor layer may be formed. Moreover, a combination of multiple types of materials may be used to constitute at least either the p-type semiconductor or the n-type semiconductor.

Note that the p-type or the n-type of the organic semiconductor indicates a type of charge easily transported. For example, the p-type organic semiconductor is characterized by easy hole transport. On the other hand, the n-type organic semiconductor is characterized by easy electron transport. In such a manner, the p-type or the n-type of the organic semiconductor is not limited to a type including holes or electrons as majority carriers for thermal excitation unlike an inorganic semiconductor.

Note that other layers may be formed between the organic photoelectric conversion layer 516 and the lower electrode 515 and between the organic photoelectric conversion layer 516 and the upper electrode 517. For example, an undercoating layer, a hole transportation layer, an electron blocking layer, an organic photoelectric conversion layer, a hole blocking layer, a buffer layer, an electron transportation layer, and a work function adjustment layer may be sequentially laminated below the lower electrode 515.

Moreover, the lower electrode 515 and the upper electrode 517 may be covered with an insulating material. For example, the material that covers the lower electrode 515 and the upper electrode 517 is metallic oxide such as a silicon oxide material, a silicon nitride ($SiN_x$), and aluminum oxide ($Al_2O_3$). However, other types of inorganic insulating materials may be used. For example, the coating layer can be formed by a dry coating method or a wet coating method.

Red, green, and blue color signals are acquirable from respective pixels by use of the imaging unit 500 having organic photoelectric conversion films.

Figure 25:
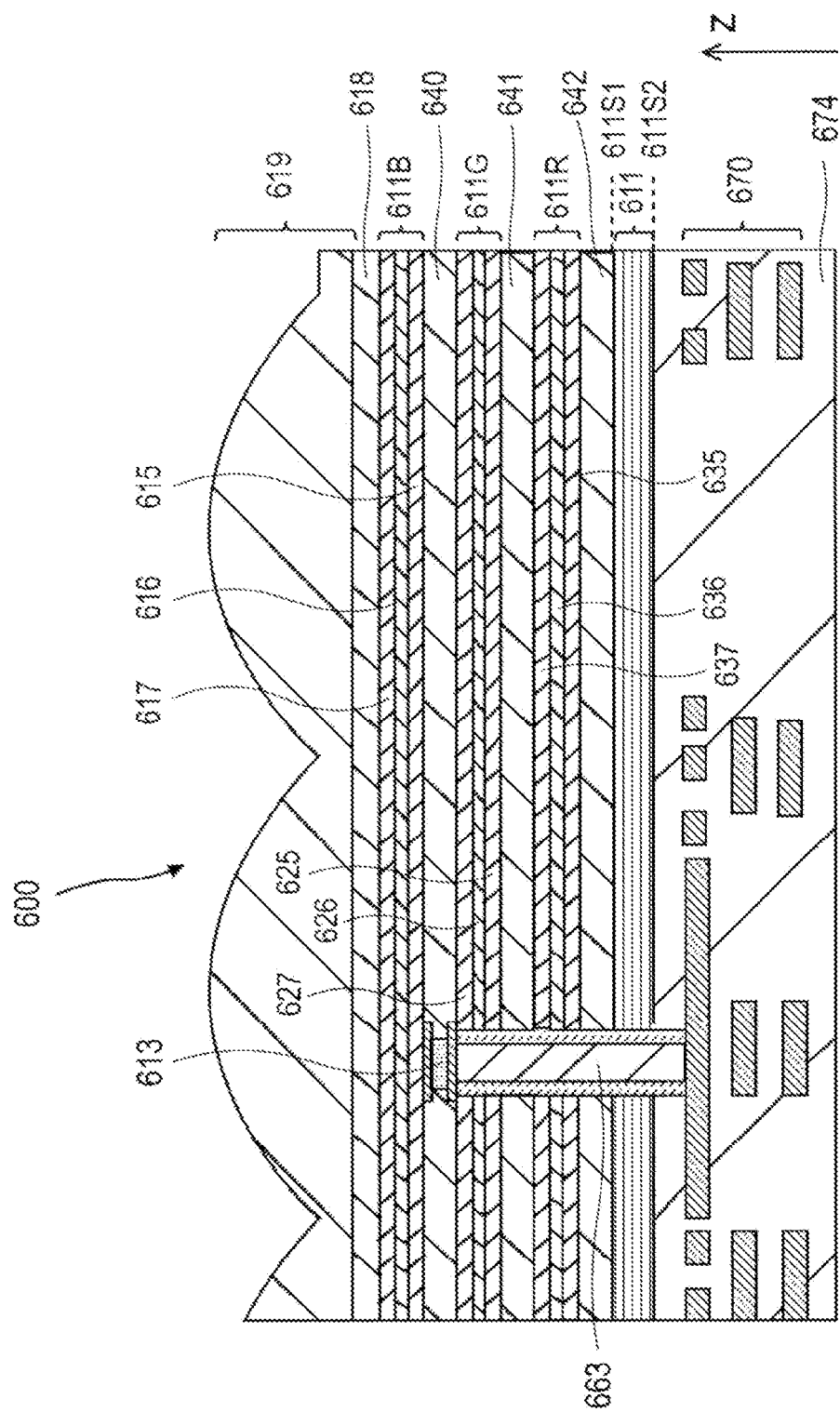
FIG. 25 is a cross-sectional diagram depicting an example of a vertical spectral diffraction type imaging unit.

FIG. 25 is a cross-sectional diagram depicting an example of the imaging unit according to modification 2. FIG. 25 similarly depicts an imaging unit 600 capable of obtaining multiple color signals without using a color filter. The imaging unit 600 is a vertical spectral diffraction imaging unit, similarly to the above, and is disposed such that multiple photoelectric conversion units designating different wavelength ranges as detection targets are laminated on each other in the z-axis direction.

A surface 611S1 of a semiconductor substrate 611 corresponds to a surface in a light entrance direction of the semiconductor substrate 611 (z-axis positive direction). Moreover, a surface 611S2 of a semiconductor substrate 611 corresponds to a surface in the direction opposite to the light entrance direction of the semiconductor substrate 611 (z-axis negative direction). It is assumed in the following description that a z-axis positive direction is referred to as "upper" and that a z-axis negative direction is referred to as "lower."

Above the semiconductor substrate 611 (surface 611S1 side), an organic photoelectric conversion unit 611B, an organic photoelectric conversion unit 611G, and an organic photoelectric conversion unit 611R are formed in this order from above. An insulation layer 642 is formed between the surface 611S1 and the organic photoelectric conversion unit 611R of the semiconductor substrate 611. Moreover, an insulation layer 641 is formed between the organic photoelectric conversion unit 611B and the organic photoelectric conversion unit 611G. Further, an insulation layer 640 is formed between the organic photoelectric conversion unit 611G and the organic photoelectric conversion unit 611B.

On the other hand, an insulation layer 674 is disposed below the semiconductor substrate 611 (surface 611S2 side). Wiring layers 670 can be formed in the insulation layer 674. Such transistor and floating diffusion layer as depicted in FIG. 24 can be formed in the semiconductor substrate 611. Note that in FIG. 25, the transistor and the floating diffusion layer are omitted.

Further, a protection layer 618 including a material exhibiting light transmissibility is formed on the organic photoelectric conversion unit 611B. An on-chip lens layer 619 is formed on the protection layer 618. For example, the on-chip lens layer 619 includes multiple on-chip lenses (microlenses) and a flattening layer. Each of the on-chip lenses concentrates incident light on each of light reception surfaces of the organic photoelectric conversion unit 611R, the organic photoelectric conversion unit 611G, and the organic photoelectric conversion unit 611B.

According to the imaging unit 600, the inorganic photoelectric conversion unit 511B and the inorganic photoelectric conversion unit 511R of the imaging unit 500 are replaced with the organic photoelectric conversion unit 611B and the organic photoelectric conversion unit 611R, respectively. Accordingly, the imaging unit 600 uses an organic photoelectric conversion film for detection of all of red, light, green light, and blue light.

The organic photoelectric conversion unit 611B includes an upper electrode 617, an organic photoelectric conversion layer 616, and a lower electrode 615. The lower electrode 615 and the upper electrode 617 are each a conductive film exhibiting light transmissibility, similarly to the lower electrode 515 and the upper electrode 517 in FIG. 24. For example, the organic photoelectric conversion layer 616 includes at least any one of a p-type organic semiconductor, an n-type organic semiconductor, and a material that photoelectrically converts light in a particular wavelength range (light absorber). The organic photoelectric conversion layer 616 may have a bulk-heterojunction structure or a laminated structure. The organic photoelectric conversion layer 616 can include a material having sensitivity to a wavelength band including blue light. For example, such a material is a material of C30 doped with fullerene, coumarin 6, a dinaphthothienothiophene (DNTT) derivative, or the like. Note that the material included in the organic photoelectric conversion layer 616 is not limited to any type.

The organic photoelectric conversion unit 611G includes an upper electrode 627, an organic photoelectric conversion layer 626, and a lower electrode 625. The upper electrode 627 and the lower electrode 625 are each a conductive film exhibiting light transmissibility, similarly to the lower electrode 515 and the upper electrode 517 in FIG. 24. The material and the configuration of the organic photoelectric conversion layer 626 are similar to those of the organic photoelectric conversion layer 516 in FIG. 24.

The organic photoelectric conversion unit 611R includes an upper electrode 637, an organic photoelectric conversion layer 636, and a lower electrode 635. The upper electrode 637 and the lower electrode 635 are each a conductive film exhibiting light transmissibility, similarly to the lower electrode 515 and the upper electrode 517 in FIG. 24. For example, the organic photoelectric conversion layer 636 includes at least any one of a p-type organic semiconductor, an n-type organic semiconductor, and a material that photoelectrically converts light in a particular wavelength range (light absorber). The organic photoelectric conversion layer 636 may have a bulk-heterojunction structure or a laminated structure. The organic photoelectric conversion layer 636 can include a material having sensitivity to a wavelength band including red light. For example, such a material is zinc phthalocyanine, boron sub-naphthalocyanine, or the like. Note that the material included in the organic photoelectric conversion layer 636 is not limited to any type.

For example, the upper electrode and the lower electrode described above can include metallic oxide such as ITO, IZO, IFO, ATO, and FTO. However, there are no limitations on the materials of the lower electrode and the upper electrode. Moreover, the lower electrode may be formed discretely for each of the imaging units as depicted in FIG. 24.

Note that, similarly to FIG. 24, other layers can be formed between the organic photoelectric conversion layer and the lower electrode and between the organic photoelectric conversion layer and the upper electrode. For example, an undercoating layer, a hole transportation layer, an electron blocking layer, an organic photoelectric conversion layer, a hole blocking layer, a buffer layer, an electron transportation layer, and a work function adjustment layer may be sequentially laminated below the lower electrode. Moreover, the lower electrode and the upper electrode may be covered with an insulating material.

FIG. 25 depicts a contact 613 and a through electrode 663 that electrically connect the organic photoelectric conversion unit 611B and the wiring layers 670 to each other. It is assumed that the contact 613 and the through electrode 663 each include a conductive material such as a doped semiconductor material, metal, and metallic oxide. Similarly, it is assumed that not-depicted contacts and through electrodes are also formed between the organic photoelectric conversion unit 611G and the wiring layers 670 and between the organic photoelectric conversion unit 611R and the wiring layers 670.

Each of the organic photoelectric conversion layers absorbs light in a predetermined wavelength range to form pairs of an electron and a hole. For example, holes shift to the upper electrode, and electrons shift to the lower electrode. The shift of the charge is controllable by applying a potential between the upper electrode and the lower electrode, similarly to the case of FIG. 24. The charge including electrons and holes is transferred to the wiring layers 670 via the contacts and the through electrodes. This charge is accumulated in a floating diffusion layer by a transistor for transfer formed within the semiconductor substrate 611. The charge accumulated in the floating diffusion layer is converted into a voltage signal by a transistor for conversion. In this manner, a color signal of red, green, or blue can be output to a circuit in a following stage. Note that a transistor for resetting the charge accumulated in the floating diffusion layer may be provided within the semiconductor substrate 611, similarly to the case in FIG. 24.

Red, green, and blue color signals are acquirable from respective pixels by use of the imaging unit 600 including the organic photoelectric conversion films.

As described above, the first imaging unit of the electronic apparatus according to the present disclosure may include multiple photoelectric conversion units disposed in the depth direction of the substrate. At least one of the multiple photoelectric conversion units may include an organic photoelectric conversion film. Specifically, the first imaging unit of the electronic apparatus according to the present disclosure may include multiple light reception surfaces. Each of the light reception surfaces may detect light in different wavelength band. Moreover, at least any one of the light reception surfaces of the first imaging unit may include an organic photoelectric conversion film.

According to the electronic apparatus of the present disclosure, the necessity of providing a front camera on a bezel is eliminated by providing the imaging unit on the side opposite to the display unit. Accordingly, an electronic apparatus having a reduced bezel width or a bezel-less type electronic apparatus is providable. Moreover, a larger-sized display unit is allowed to be mounted without increasing the size of the housing of the electronic apparatus. Accordingly, demands for both miniaturization of the electronic apparatus and screen enlargement can be met.

Further, according to the electronic apparatus of the present disclosure, a ratio of blue light detection pixels of the first imaging unit disposed on the side opposite to the display unit can be made higher than that of the second imaging unit disposed on the surface on the side opposite to the display unit. In addition, according to the electronic apparatus of the present disclosure, the ratio of the blue light detection pixels of the first imaging unit disposed on the side opposite to the display unit can be made higher than ¼. In this manner, it is achievable to compensate for sensitivity to a wavelength band including attenuated blue light which is included in light having passed through the display unit and to prevent image quality deterioration of a captured image.

Note that compensation for sensitivity to the wavelength band including blue light may be achieved using a blue light flash during imaging in the electronic apparatus according to the present disclosure. Moreover, multiple imaging units may be disposed on the side opposite to the display unit in the electronic apparatus according to the present disclosure. In this case, the imaging units each having a different pixel array may be disposed on the side opposite to the display unit. For example, an imaging unit having a higher ratio of blue light detection pixels than that of a Bayer array and an imaging unit having sensitivity to a wavelength band including blue light at a level similar to that of sensitivity of a Bayer array can be combined. Compensation for sensitivity to the wavelength band including blue light is achievable while sufficient resolution of images is secured, by performing image synthesis or image correction with use of images captured by the multiple imaging units.

Figure 26:
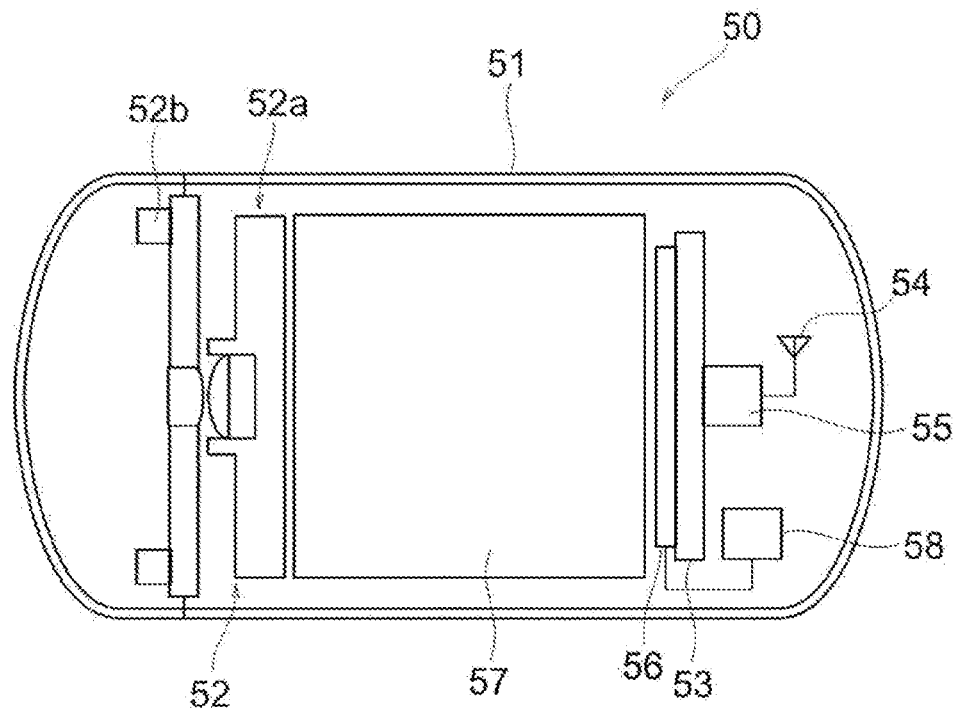
FIG. 26 is a plan diagram depicting a case where the electronic apparatus according to the present disclosure is applied to a capsule endoscope.

There are various types considered to be specific possible candidates of the electronic apparatus configured as described above. For example, FIG. 26 is a plan diagram of the electronic apparatus according to the present disclosure applied to a capsule endoscope 50. The capsule endoscope 50 depicted in FIG. 26 includes a camera 52 (ultraminiature camera) for capturing an image of an inside of a body cavity, a memory 53 for recording image data captured by the camera 52, and a wireless transmitter 55 for transmitting recorded image data to the outside via an antenna 54 after the capsule endoscope 50 is discharged to the outside of the body of an examinee. All the components 52 to 55 are included in a housing 51 having semispherical shapes at both end surfaces and a cylindrical shape at a central portion, for example.

Moreover, a CPU (Central Processing Unit) 56 and a coil (magnetic force and current conversion coil) 57 are provided within the housing 51. The CPU 56 controls imaging using the camera 52 and an operation for data accumulation in the memory 53, and controls transmission of data from the memory 53 to a data reception device (not depicted) outside the housing 51 with use of the wireless transmitter 55. The coil 57 supplies power to the camera 52, the memory 53, the wireless transmitter 55, the antenna 54, and light sources 52b which will be described below, Moreover, a magnetic (lead) switch 58 is provided in the housing 51 to detect the capsule endoscope 50 when the capsule endoscope 50 is set on the data reception device. At the time when the lead switch 58 detects that the capsule endoscope 50 is set on the data reception device and data transmission is allowed, the CPU 56 supplies power from the coil 57 to the wireless transmitter 55.

For example, the camera 52 includes an imaging element 52a including the objective optical system 9 for capturing an image of the inside of the body cavity, and multiple light sources 52b for illuminating the inside of the body cavity. Specifically, for example, the camera 52 includes a CMOS (Complementary Metal Oxide Semiconductor) sensor including an LED (Light Emitting Diode), a CCD (Charge Coupled Device), or the like to function as the Tight sources 52b.

The display unit 2 included in the electronic apparatus according to the above embodiments is a concept including such a light emitter as the light sources 52b depicted in FIG. 26. The capsule endoscope 50 in FIG. 26 has the two light sources 52b, for example. The light sources 52b can include the display panel 4 having multiple light source units, or an LED module having multiple LEDs. In this case, limitations imposed on the layout arrangement of the camera 52 can be reduced by arranging the imaging unit 8 of the camera 52 below the display panel 4 or the LED module. Accordingly, the capsule endoscope 50 can be made more compact.

Figure 27:
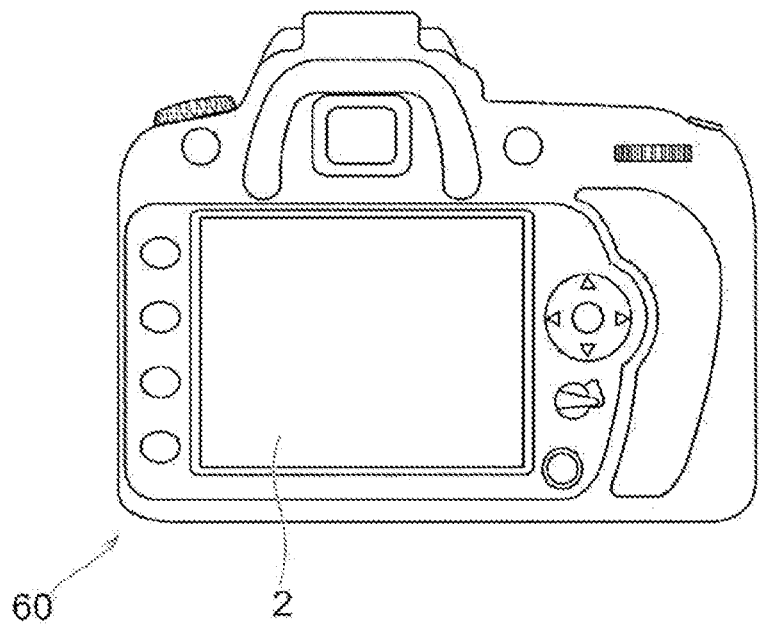
FIG. 27 is a rear diagram depicting a case where the electronic apparatus according to the present disclosure is applied to a digital single lens reflex camera.

Further, FIG. 27 is a rear diagram in a case where the electronic apparatus according to the present disclosure is applied to a digital single lens reflex camera 60. The digital single lens reflex camera 60 or a compact camera includes the display unit 2 provided on the rear surface opposite to a lens to display a preview screen. The camera module 3 may be disposed on the side opposite to the display surface of the display unit 2 to display a face image of an image capturing person on the display screen 1a of the display unit 2. According to the electronic apparatus of the present disclosure, the camera module 3 is allowed to be disposed in a region overlapping with the display unit 2. Accordingly, the camera module 3 need not be provided in a bezel portion of the display unit 2, and therefore the size of the display unit 2 can be enlarged as much as possible.

Figure 28:
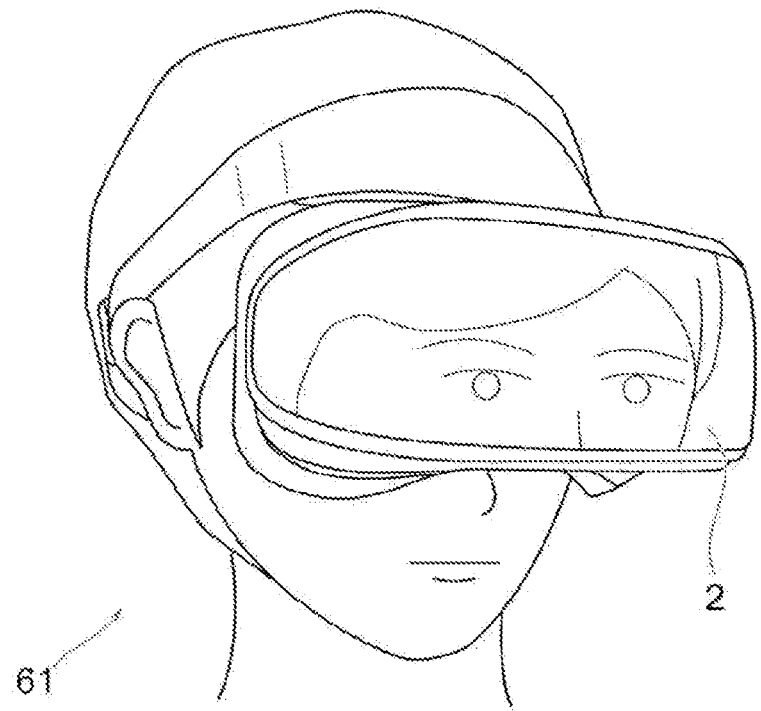
FIG. 28 is a diagram depicting an example of an electronic apparatus 1 applied to an HMD.
Figure 29:
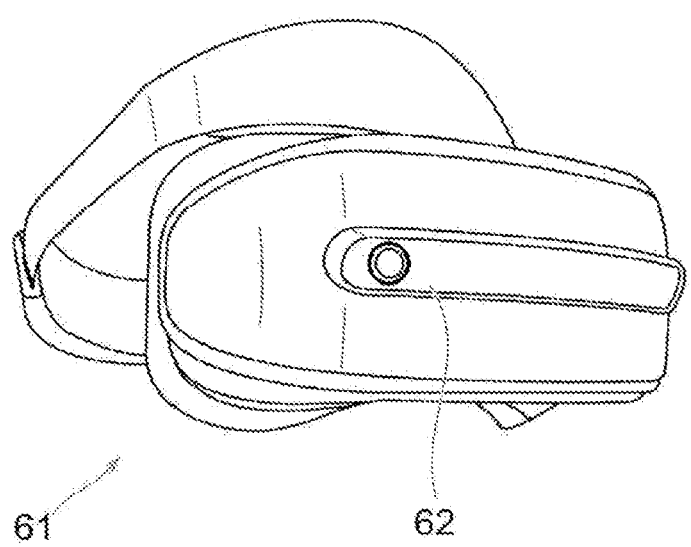
FIG. 29 is a diagram depicting an HMD currently available.

FIG. 28 is a plan view depicting an example where the electronic apparatus according to the present disclosure is applied to a head mounted display (hereinafter referred to as an HMD) 61. The HMD 61 depicted in FIG. 28 is used for VR (Virtual Reality), AR (Augmented Reality), MR (Mixed Reality), SR (Substitutional Reality), or the like. An HMD currently available carries a camera 62 on an external surface as depicted in FIG. 29. In this case, a wearer of the HMD is allowed to view a surrounding image. However, there arises such a problem that a surrounding person is unable to recognize the eyes or a facial expression of the wearer of the HMD.

Accordingly, the example depicted in FIG. 28 provides the display surface of the display unit 2 on an external surface of the HMD 61 and provides the camera module 3 on the side opposite to the display surface of the display unit 2. In this case, a facial expression of the wearer captured by the camera module 3, can be displayed on the display surface of the display unit 2. Accordingly, the facial expression or the eye movement of the wearer is recognizable in real time by a person around the wearer.

In the case of FIG. 28, the camera module 3 is provided on the rear surface side of the display unit 2. Accordingly, no limitation is imposed on an installation position of the camera module 3, and therefore the degree of freedom of designing of the HMD 61 can be raised. Moreover, the camera can be disposed at an optimum position. Accordingly, such problems as deviation of a visual line of the wearer displayed on the display surface are avoidable.

As described above, the electronic apparatus according to the present disclosure is applicable to various use purposes. Accordingly, utility values of the apparatus are allowed to increase.

Note that the present technology can have following configurations.

(1)

An electronic apparatus including:

a display unit disposed on a first surface;

a first imaging unit disposed on a side opposite to a display surface of the display unit; and a second imaging unit disposed on a second surface on a side opposite to the first surface, in which sensitivity of the first imaging unit to a first wavelength band that includes blue light is higher than sensitivity of the second imaging unit to the first wavelength band.

(2)

The electronic apparatus according to (1), in which the first imaging unit receives light having passed through the display unit.

(3)

The electronic apparatus according to (1) or (2), in which a ratio of blue light detection pixels in a pixel array of the first imaging unit is higher than a ratio of blue light detection pixels in a pixel array of the second imaging unit.

(4)

The electronic apparatus according to (3), in which the blue light detection pixels include at least any of a blue pixel, a magenta pixel, and a cyan pixel.

(5)

The electronic apparatus according to any one of (1) to (3), in which the first imaging unit includes at least any of a cyan pixel, a magenta pixel, and a yellow pixel.

(6)

The electronic apparatus according to any one of (1) to (5), further including:

a first light source disposed on the first surface and configured to emit blue light during imaging by the first imaging unit.

(7)

The electronic apparatus according to (6), further including:

a second light source disposed on the first surface and configured to emit white light during imaging by the first imaging unit; and a processing circuit configured to generate an image by synthesizing a first image and a second image, the first image being captured by the first imaging unit during light emission from the first light source, the second image being captured by the first imaging unit during light emission from the second light source.

(8)

The electronic apparatus according to any one of (1) to (5), further including:

a first light source disposed on the first surface and configured to emit light during imaging by the first imaging unit;

the second imaging unit disposed on the second surface on the side opposite to the first surface; and a third light source disposed on the second surface and configured to emit light during imaging by the second imaging unit, in which a color temperature of the first light source is higher than a color temperature of the third light source.

(9)

The electronic apparatus according to any one of (1) to (8), further including:

a third imaging unit that is disposed on the side opposite to the display surface of the display unit and has lower sensitivity to the first wavelength band than the sensitivity of the first imaging unit to the first wavelength band; and a processing circuit configured to generate an image by synthesizing a third image captured by the first imaging unit and a fourth image captured by the third imaging unit.

(10)

The electronic apparatus according to any one of (1) to (9), in which the first imaging unit has multiple photoelectric conversion units arranged in a depth direction of a substrate.

(11)

The electronic apparatus according to (10), in which at least any one of the multiple photoelectric conversion units includes an organic photoelectric conversion film.

(12)

An electronic apparatus including:

a display unit disposed on a first surface; and first imaging unit that is disposed on a side opposite to a display surface of the display unit and includes multiple pixels for photoelectrically converting light having entered via the display unit, in which a ratio of blue light detection pixels included in the multiple pixels is higher than ¼.

(13)

The electronic apparatus according to (12), in which the blue light detection pixels include at least any of a blue pixel, a magenta pixel, and a cyan pixel.

(14)

The electronic apparatus according to (12) or (13), in which the first imaging unit includes at least any of a cyan pixel, a magenta pixel, and a yellow pixel.

(15)

The electronic apparatus according to any one of (12) to (14), further including:

a first light source disposed on the first surface and configured to emit blue light during imaging by the first imaging unit.

(16)

The electronic apparatus according to (15), further including:

a second light source disposed on the first surface and configured to emit white light during imaging by the first imaging unit; and a processing circuit configured to generate an image by synthesizing a first image and a second image, the first image being captured by the first imaging unit during light emission from the first light source, the second image being captured by the first imaging unit during light emission from the second light source.

(17)

The electronic apparatus according to any one of (12) to (14), further including:

a first light source disposed on the first surface and configured to emit light during imaging by the first imaging unit;

a second imaging unit disposed on a second surface on a side opposite to the first surface; and a third light source disposed on the second surface and configured to emit light during imaging by the second imaging unit, in which a color temperature of the first light source is higher than a color temperature of the third light source.

(18)

The electronic apparatus according to any one of (12) to (17), further including:

a third imaging unit that is disposed on the side opposite to the display surface of the display unit and has a lower ratio of the blue light detection pixels than a ratio of the blue light detection pixels of the first imaging unit; and a processing circuit configured to generate an image by synthesizing a third image captured by the first imaging unit and a fourth image captured by the third imaging unit.

(19)

The electronic apparatus according to any one of (12) to (18), in which the first imaging unit has multiple photoelectric conversion units arranged in a depth direction of a substrate.

(20)

The electronic apparatus according to (19), in which at least any one of the multiple photoelectric conversion units includes an organic photoelectric conversion film.

(21)

The electronic apparatus according to any one of (12) to (20), in which the first imaging unit has a pixel array where at least either green pixels or red pixels in a Bayer array are replaced with pixels in a color having a shorter wavelength.

(22)

The electronic apparatus according to any one of (1) to (11), in which the first imaging unit has a pixel array where at least either green pixels or red pixels in a Bayer array are replaced with pixels in a color having a shorter wavelength.

Modes of the present disclosure are not limited to the individual embodiments described above, and also include various modifications which may be conceived of by those skilled in the art. In addition, advantageous effects of the present disclosure are not limited to the contents described above. Specifically, various additions, changes, and partial deletions can be made without departing from the scope of conceptual spirits and purposes of the present disclosure derived from the contents and equivalents of those specified in the claims

REFERENCE SIGNS LIST

1: Electronic apparatus
1a: Display screen
1b: Bezel
2: Display unit
3, 10: Camera module
4: Display panel
5: Circularly polarized plate
6: Touch panel
6A: Fingerprint sensor
7: Cover glass
8, 8A, SB: Imaging unit
8a: Photoelectric conversion unit
9, 9A: Optical system
23: Protection cover
42, 43, 44: Flash

The invention claimed is:

1. An electronic apparatus comprising:
a display including a display surface;
a first image sensor configured to detect light in a direction incident upon the display surface and arranged under the display surface in a cross sectional view; and
a second image sensor disposed separately from the first image sensor, the second image sensor being configured to detect light in the direction incident upon the display surface and arranged at a level lower than the display surface in the cross sectional view, wherein
the first and second image sensors have a sensitivity to a first wavelength band that includes blue light, and the sensitivity of the first image sensor to the first wavelength band is higher than the sensitivity of the second image sensor to the first wavelength band.

2. The electronic apparatus according to claim 1, wherein the first image sensor is configured to receive light that passes through the display surface and the second image sensor is configured to receive light that does not pass through the display surface.

3. The electronic apparatus according to claim 1, wherein a ratio of blue light detection pixels in a pixel array of the first image sensor is higher than a ratio of blue light detection pixels in a pixel array of the second image sensor.

4. The electronic apparatus according to claim 3, wherein the blue light detection pixels include at least any of a blue pixel, a magenta pixel, and a cyan pixel.

5. The electronic apparatus according to claim 1, wherein the first image sensor includes at least any of a cyan pixel, a magenta pixel, and a yellow pixel.

6. The electronic apparatus according to claim 1, further comprising:
a first light source disposed at a display surface side and configured to emit blue light during imaging by the first image sensor.

7. The electronic apparatus according to claim 6, further comprising:
a second light source disposed at the display surface side and configured to emit white light during imaging by the first image sensor; and
a processing circuit configured to generate an image by synthesizing a first image and a second image, the first image being captured by the first image sensor during light emission from the first light source, the second image being captured by the first image sensor during light emission from the second light source.

8. The electronic apparatus according to claim 1, further comprising:
a first light source disposed at a display surface side and configured to emit light during imaging by the first image sensor;
a second light source disposed at the display surface side and configured to emit light during imaging by the second image sensor, wherein
a color temperature of the first light source is higher than a color temperature of the second light source.

9. The electronic apparatus according to claim 7, further comprising:
a third image sensor that is disposed at a side opposite to the display surface and that has lower sensitivity to the first wavelength band than the sensitivity of the first image sensor to the first wavelength band; and
a processing circuit configured to generate an image by synthesizing a third image captured by the first image sensor and a fourth image captured by the third image sensor.

10. The electronic apparatus according to claim 1, wherein
the first image sensor has multiple photoelectric conversion units arranged in a depth direction of a substrate.

11. The electronic apparatus according to claim 10, wherein
at least one of the multiple photoelectric conversion units includes an organic photoelectric conversion film.

12. An electronic apparatus comprising:
a display including a display surface; and
a first image sensor configured to detect light in a direction incident upon the display surface and arranged under the display surface in a cross sectional view;
a second image sensor disposed separately from the first image sensor, the second image sensor being configured to detect light in the direction incident upon the display surface and arranged at a level lower than the display surface in the cross sectional view;
a first light source disposed a display surface side and configured to emit light during imaging by the first image sensor; and
a second light source disposed at the display surface side and configured to emit light during imaging by the second image sensor, wherein
a color temperature of the first light source is higher than a color temperature of the third light source, and
a ratio of blue light detection pixels included in pixels of the first image sensor is higher than 1/4.

13. The electronic apparatus according to claim 12, wherein
the blue light detection pixels include at least any of a blue pixel, a magenta pixel, and a cyan pixel.

14. The electronic apparatus according to claim 12, wherein
the first image sensor includes at least any of a cyan pixel, a magenta pixel, and a yellow pixel.

15. The electronic apparatus according to claim 12, further comprising:
a third light source disposed at the display surface side and configured to emit white light during imaging by the first image sensor; and
a processing circuit configured to generate an image by synthesizing a first image and a second image, the first image being captured by the first image sensor during light emission from the first light source, the second image being captured by the first image sensor during light emission from the third light source.

16. The electronic apparatus according to claim 12, wherein
the first image sensor has multiple photoelectric conversion units arranged in a depth direction of a substrate.

17. The electronic apparatus according to claim 16, wherein
at least one of the multiple photoelectric conversion units includes an organic photoelectric conversion film.

18. An electronic apparatus comprising:
a display including a display surface; and
a first image sensor configured to detect light in a direction incident upon the display surface and arranged under the display surface in a cross sectional view;
a second image sensor disposed separately from the first image sensor, the second image sensor being configured to detect light in the direction incident upon the display surface and arranged at a level lower than the display surface in the cross sectional view;
a third image sensor that is disposed at a side opposite to the display surface and that has a lower ratio of the blue light detection pixels than a ratio of the blue light detection pixels of the first image sensor; and
a processing circuit configured to generate an image by synthesizing a third image captured by the first image sensor and a fourth image captured by the third image sensor, wherein
a ratio of blue light detection pixels included in pixels of the first image sensor is higher than 1/4.

\* \* \* \* \*